United States Patent
Peng et al.

(10) Patent No.: US 12,322,595 B2
(45) Date of Patent: Jun. 3, 2025

(54) SEMICONDUCTOR DEVICES DEVICES INCLUDING CRYSTALLIZED LAYER HAVING MULTIPLE CRYSTALLINE ORIENTATIONS AND METHODS OF MANUFACTURE

(71) Applicant: Taiwan Semiconductor Manufacturing Co., Ltd., Hsinchu (TW)

(72) Inventors: Chun-Yen Peng, Hsinchu (TW); Te-Yang Lai, Hsinchu (TW); Sai-Hooi Yeong, Zhubei (TW); Chi On Chui, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/738,742

(22) Filed: Jun. 10, 2024

(65) Prior Publication Data
US 2024/0332010 A1    Oct. 3, 2024

Related U.S. Application Data

(60) Continuation of application No. 18/446,953, filed on Aug. 9, 2023, now Pat. No. 12,033,853, which is a (Continued)

(51) Int. Cl.
*H01L 21/02* (2006.01)
*H01L 21/768* (2006.01)
(Continued)

(52) U.S. Cl.
CPC .. *H01L 21/02609* (2013.01); *H01L 21/02181* (2013.01); *H01L 21/02356* (2013.01); (Continued)

(58) Field of Classification Search
CPC .......... H01L 21/02181; H01L 21/0234; H01L 21/02356; H01L 21/02609; H01L 21/02667; H01L 21/28008; H01L 21/28185; H01L 21/31155; H01L 21/76829; H01L 21/76871; H01L 21/823462; H10D 12/211; H10D 18/40; (Continued)

(56) References Cited

U.S. PATENT DOCUMENTS 8,962,400 B2   2/2015 Tsai et al.
9,093,514 B2   7/2015 Tsai et al.
(Continued)

*Primary Examiner* — Cheung Lee
(74) *Attorney, Agent, or Firm* — Slater Matsil, LLP

(57) ABSTRACT

A method for forming a crystalline high-k dielectric layer and controlling the crystalline phase and orientation of the crystal growth of the high-k dielectric layer during an anneal process. The crystalline phase and orientation of the crystal growth of the dielectric layer may be controlled using seeding sections of the dielectric layer serving as nucleation sites and using a capping layer mask during the anneal process. The location of the nucleation sites and the arrangement of the capping layer allow the orientation and phase of the crystal growth of the dielectric layer to be controlled during the anneal process. Based on the dopants and the process controls used the phase can be modified to increase the permittivity and/or the ferroelectric property of the dielectric layer.

20 Claims, 17 Drawing Sheets

Related U.S. Application Data continuation of application No. 17/321,691, filed on May 17, 2021, now Pat. No. 11,823,894, which is a division of application No. 16/549,502, filed on Aug. 23, 2019, now Pat. No. 11,011,372.

(51) Int. Cl.

| | | |
|---|---|---|
| *H10D 30/01* | (2025.01) | |
| *H10D 30/62* | (2025.01) | |
| *H10D 64/27* | (2025.01) | |
| *H10D 64/01* | (2025.01) | |

(52) U.S. Cl.
CPC .. *H01L 21/02667* (2013.01); *H01L 21/76829* (2013.01); *H01L 21/76871* (2013.01); *H10D 30/024* (2025.01); *H10D 30/62* (2025.01); *H10D 64/514* (2025.01); *H10D 64/017* (2025.01)

(58) Field of Classification Search
CPC ....... H10D 30/019–0198; H10D 30/01; H10D 30/024; H10D 30/0273; H10D 30/501–509; H10D 30/62; H10D 30/721; H10D 64/017; H10D 64/117; H10D 64/252; H10D 64/2523; H10D 64/2527; H10D 64/514; H10D 64/666; H10D 84/903

See application file for complete search history.

(56) References Cited

U.S. PATENT DOCUMENTS

| | | |
|---|---|---|
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |
| 9,812,363 B1 | 11/2017 | Liao et al. |
| 9,859,380 B2 | 1/2018 | Lee et al. |
| 2007/0176227 A1 | 8/2007 | Liu et al. |
| 2015/0255277 A1 | 9/2015 | Tong et al. |
| 2019/0019880 A1 | 1/2019 | Mun et al. |
| 2019/0164809 A1 | 5/2019 | Meyer et al. |
| 2020/0119047 A1 | 6/2020 | Yoo et al. |

SEMICONDUCTOR DEVICES DEVICES INCLUDING CRYSTALLIZED LAYER HAVING MULTIPLE CRYSTALLINE ORIENTATIONS AND METHODS OF MANUFACTURE

PRIORITY CLAIM AND CROSS-REFERENCE

This application is a continuation of U.S. patent application Ser. No. 18/446,953, filed on Aug. 9, 2023, entitled "Semiconductor Devices and Methods of Manufacture," which is a continuation of U.S. patent application Ser. No. 17/321,691, filed on May 17, 2021, entitled "Semiconductor Devices and Methods of Manufacture," now U.S. Pat. No. 11,823,894, issued on Nov. 21, 2023, which is a divisional of U.S. patent application Ser. No. 16/549,502, filed on Aug. 23, 2019, entitled "Semiconductor Devices and Methods of Manufacture," now U.S. Pat. No. 11,011,372, issued on May 18, 2021, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
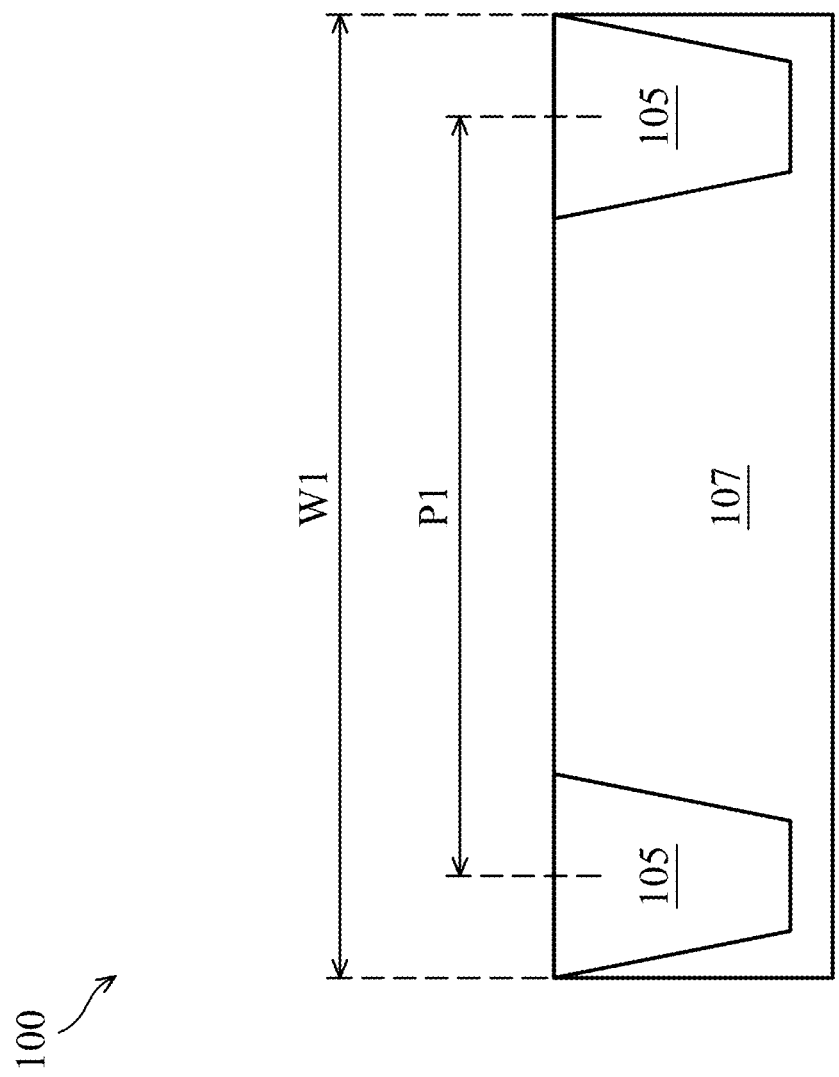
FIGS. 1-9 illustrate steps in a process of forming a planar metal-oxide semiconductor field-effect transistor (MOSFET) device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely semiconductor devices with one or more planar metal-oxide semiconductor field-effect transistor (MOSFET) devices and/or with one or more fin field-effect transistor (finFET) devices and, more particularly, to methods of forming high-k gate dielectrics in planar MOSFET devices and in finFET devices. Although embodiments are described in these contexts, other embodiments may also be applied, however, to forming high-k gate dielectrics in other suitable semiconductor or electronic devices.

With reference now to FIG. 1, there is shown an intermediate structure in the formation of a planar MOSFET device 100 including a substrate 107 with shallow trench isolations (STIs) 105 formed therein. The substrate 107 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The STIs 105 are generally formed by removing material of the substrate 107 (e.g., via reactive ion etching (RIE)) to form shallow trenches and by filling the shallow trenches (e.g., via chemical vapor deposition (CVD)) with a dielectric material. In some embodiments, the STIs 105 are filled with a dielectric material such as an oxide material, a high-density plasma (HDP) oxide, or the like. Once filled, the STIs 105 may be planarized (e.g., via chemical mechanical planarization (CMP)) with the surface of the substrate 107. However, any suitable material removal process may be used to form the shallow trenches, any suitable dielectric material and any suitable deposition process may be used to fill the STIs 105 and any suitable planarization process may be used to planarize the STIs 105 with the surface of the substrate 107.

According to some embodiments, as further illustrated in FIG. 1, the STIs 105 may be formed within a section of the substrate 107 having a first width W1 of between about 5 nm and about 1 µm, such as about 20 nm with a pitch P1 between the STIs 105 being between about 3 nm and about 1 µm, such as about 10 nm. However, any suitable widths and any suitable pitches may be used for the overall first width W1 of the section of the substrate 107 and the pitch P1 between STIs 105. Furthermore, the STIs 105 may be formed to any suitable shapes and to any suitable dimensions (e.g., lengths, widths, depths).

Figure 2:
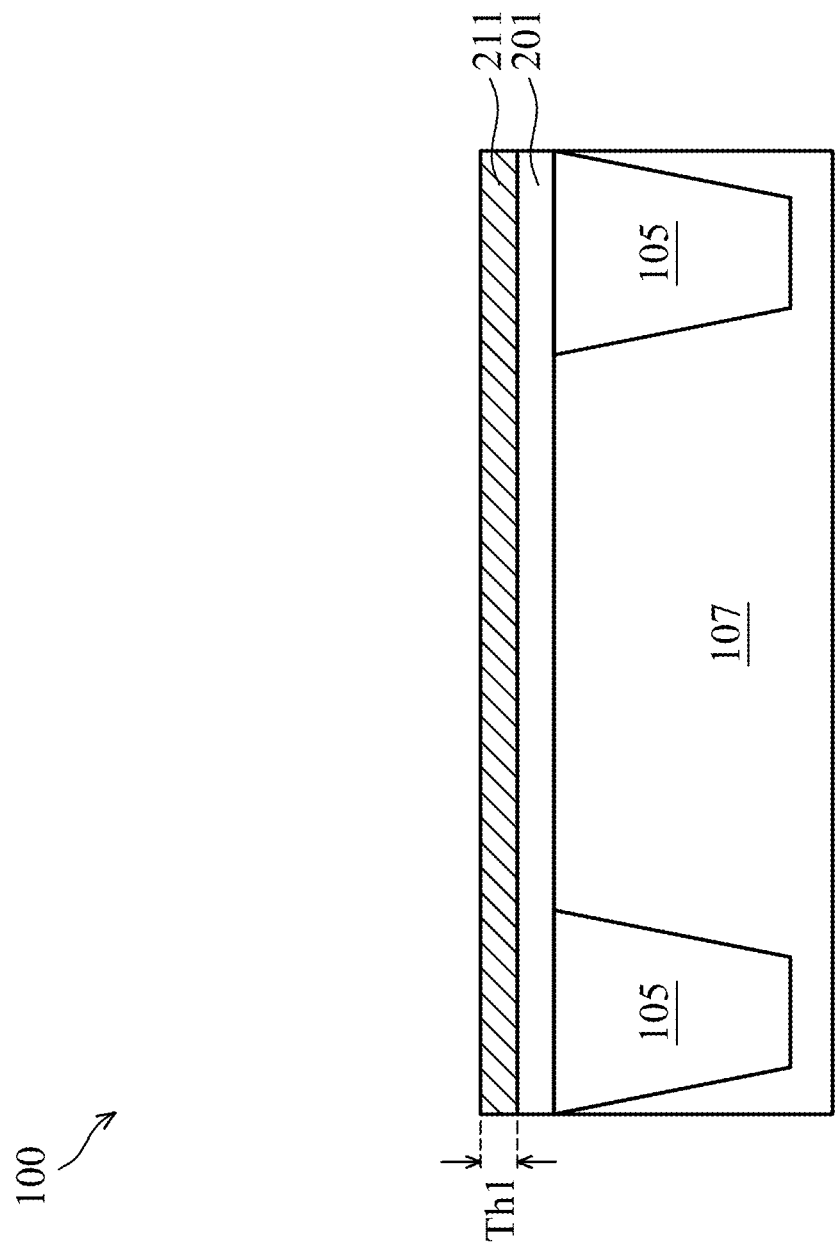

Turning to FIG. 2, an optional interfacial layer 201 (e.g., a base oxide layer) may be formed over the substrate 107. In an embodiment the interfacial layer 201 is utilized to reduce damage between the substrate 107 and an overlying layer, e.g., a high-k dielectric layer. In an embodiment the interfacial layer 201 comprises a buffer material such as silicon oxide, although any suitable material may be utilized. The interfacial layer 201 may be formed using a process such as CVD, PVD, or even oxidation of the substrate 107. However, any suitable process may be utilized.

In some embodiments, the optional interfacial layer 201 is formed by submerging the substrate 107 into a solution, which contains de-ionized water and ozone ($O_3$) and is referred to herein as $DiO_3$ solution. The $DiO_3$ solution is preferably ultra-diluted, containing $O_3$ of between about 1 part per million (ppm) and about 100 ppm, such as, between about 1 ppm and about 10 ppm. However, any suitable dilution may be used. The oxidation may be performed at room temperature, for example, about 25° C., although higher or lower temperatures can be used. In some embodiments, the process time is between about 10 seconds to about 300 seconds. However, any suitable methods of formation, such as forming a silicon-rich film over the substrate 107 and subjecting the silicon-rich film to an oxidizing environment such as steam or oxygen-containing ambient at a temperature of between about 600° C. and about 1,100° C., could also be utilized.

In some embodiments, the optional interfacial layer 201 is formed to a desired thickness of between about 1 Å and about 20 Å, such as about 9 Å. The thickness of the optional interfacial layer 201 can be controlled by adjusting the process conditions such as time, temperature, etc. Given a process time, the thickness of the optional interfacial layer 201 may be affected by the process temperature. For example, by using a low temperature a slower oxide formation occurs and, thus, a thin oxide film may be formed to a desired thickness for the optional interfacial layer 201. However, any suitable method of formation and any suitable thickness may be used for the optional interfacial layer 201.

FIG. 2 further illustrates the formation of an amorphous high-k dielectric layer 211 over the substrate 107 and, if formed, over the optional interfacial layer 201. In some embodiments, the amorphous high-k dielectric layer 211 includes high-k materials such as hafnium oxide ($HfO_2$), zirconium oxide ($ZrO_2$), yttrium oxide ($Y_2O_3$), lanthanum oxide ($La_2O_3$), scandium oxide ($Sc_2O_3$), aluminum oxide ($Al_2O_3$), and complexes thereof. The high-k materials may include undoped films and doped films. According to some embodiments, the amorphous high-k dielectric layer 211 may comprise dopants such as silicon (Si), yttrium (Y), zirconium (Zr), scandium (Sc), lanthanum (La), aluminum (Al), gadolinium (Gd), and the like.

According to some embodiments, the relative permittivity (i.e., k value) of the amorphous high-k dielectric layer 211 is greater than about 7 to minimize and/or prevent leakage current through the amorphous high-k dielectric layer 211 of the planar MOSFET device 100 once formed. In some embodiments, the amorphous high-k dielectric layer 211 may be formed with an amorphous structure and/or with a partially crystallized structure including crystalline regions formed within and separated by an amorphous matrix layer of the amorphous high-k dielectric layer 211. According to some embodiments, the amorphous high-k dielectric layer 211 may be formed to a first thickness Th1 of between about 10 Å and about 30 Å, such as less than 20 Å, while minimizing and/or altogether preventing leakage current through the amorphous high-k dielectric layer 211 of the planar MOSFET device 100.

According to some embodiments, the amorphous high-k dielectric layer 211 is formed via atomic layer deposition (ALD). However, other suitable methods such as plasma enhanced chemical vapor deposition (PECVD), low-pressure chemical vapor deposition (LPCVD), metal-organic chemical vapor deposition (MOCVD), plasma enhanced atomic layer deposition (PEALD), and the like, can also be used. In some embodiments, the amorphous high-k dielectric layer 211 is formed at a low temperature, for example, between about 500° C. and about 250° C., such as about 350° C., or even below about 250° C. Performing the amorphous high-k dielectric layer 211 depositions at these low temperatures prevents re-growth of an interfacial oxide layer between the substrate 107 and the overlying amorphous high-k dielectric layer 211.

Figure 3:
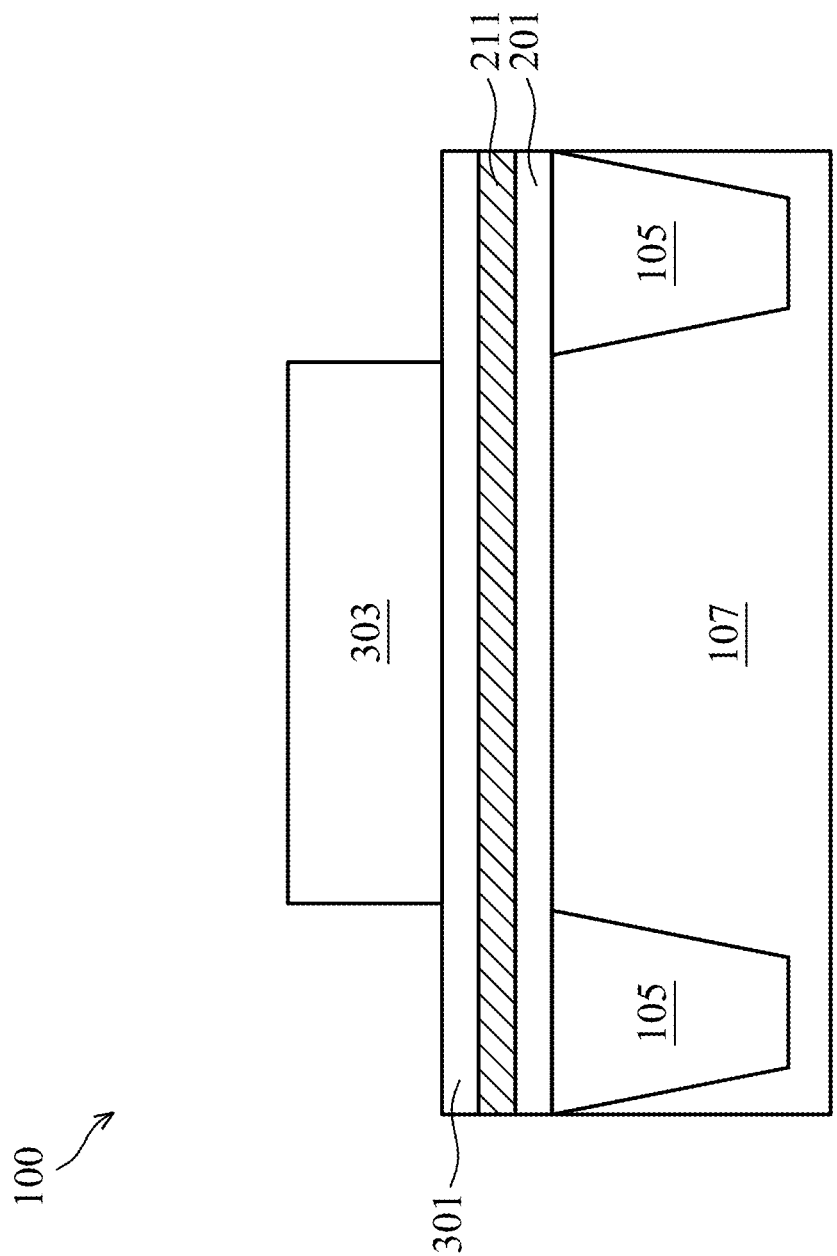

FIG. 3 illustrates a deposition process of a capping layer 301 over the amorphous high-k dielectric layer 211. According to some embodiments, the capping layer 301 may serve as a crystallization barrier for a portion of the amorphous high-k dielectric layer 211 during subsequent crystallization processes which are described in greater detail below. The capping layer 301 may be deposited as a single layer or as a multi-layer thin film using one or more materials including TiN, TiSiN, TaN, amorphous silicon (e.g., a-Si), poly silicon, compounds thereof, or the like. The capping layer 301 may be deposited through a process such as atomic layer deposition (ALD), chemical vapor deposition (CVD), and/or physical vapor deposition (PVD) and the like to a thickness of between about 5 Å and about 5 µm, such as about 15 Å. Although any suitable material, any suitable deposition process, and any suitable thickness may be utilized for the capping layer 301.

FIG. 3 further illustrates the deposition and patterning of a first hardmask 303 over the capping layer 301 in order to expose portions of the capping layer 301 as intermediate steps in the process of forming the MOSFET device 100 in accordance with some embodiments. In an embodiment the first hardmask 303 may be a dielectric material such as silicon nitride, although any suitable masking material may be utilized.

Once the first hardmask 303 has been placed, the first hardmask 303 is patterned. In an embodiment the first hardmask 303 may be patterned by depositing and then exposing a photosensitive material or photoresist onto the first hardmask 303. In an embodiment, the photosensitive material may be exposed by generating and directing a patterned energy source onto the photosensitive material. The impact of the energy from the patterned energy source causes a chemical reaction in those parts of the photosensitive material that are impacted by the patterned energy source, thereby modifying the physical properties of the exposed portions of the photosensitive material such that the physical properties of the exposed portions of the photosensitive material are different from the physical properties of the unexposed portions of the photosensitive material. The photosensitive material is then developed with, e.g., a developer in order to separate the exposed portion of the photosensitive material from the unexposed portion of the photosensitive material with portions of the first hardmask 303 being exposed through the patterned photosensitive material. Once developed, the pattern of the photosensitive material may be transferred into the first hardmask 303 by using the patterned photosensitive material as a mask and by performing an anisotropic etch on the exposed portions of the first hardmask 303. Once the pattern has been transferred into the first hardmask 303, portions of the capping layer 301 are exposed through the openings of the pattern in the first hardmask 303.

Figure 4:
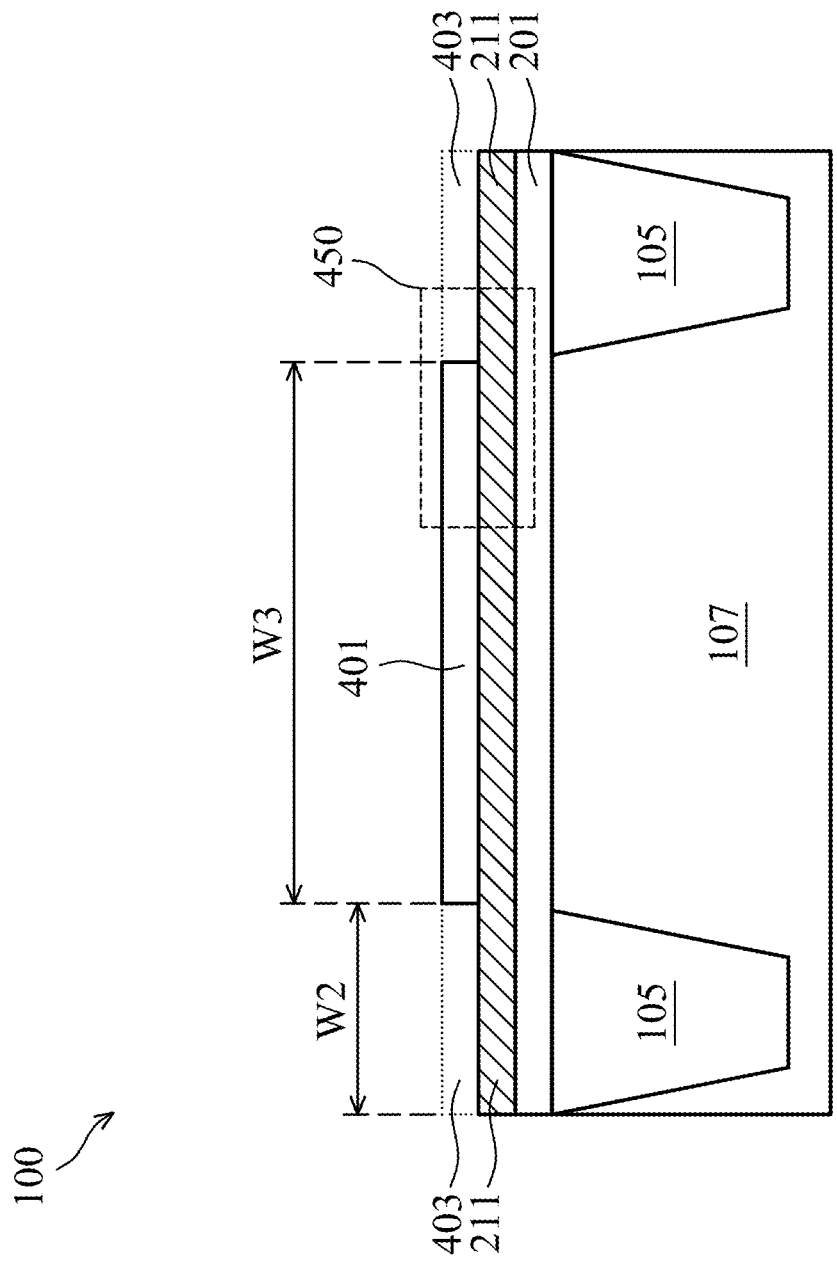

FIG. 4 illustrates the formation of capping layer openings 403 in the capping layer 301 to form a capping mask 401. The exposed portions of the capping layer 301 are removed using the first hardmask 303 and by performing an anisotropic etching process (e.g., reactive ion etching (RIE)) to form the capping layer openings 403 through the capping layer 301. In some embodiments, the etching process may etch into the material of the exposed portions of the amorphous high-k dielectric layer 211 reducing the thickness of the material in the area of the openings 403. In other embodiments, the etching process is stopped at the surface of the amorphous high-k dielectric layer 211 without reducing the thickness of the material. As such, the pattern of the first hardmask 303 is transferred into the capping layer 301 to form the capping mask 401. However, any suitable process, such as a wet etching process, and any suitable reactants may also be used to transfer the pattern into the capping layer 301.

The capping mask 401 may be formed to reduce the barrier to crystallization of the exposed portions of the amorphous high-k dielectric layer 211 and in preparation for a seeding process to be performed. According to some embodiments, the capping layer openings 403 are formed through the capping layer 301 to a second width W2 of between about 2 nm and about 1 μm, such as about 10 nm. As such, the remaining portions of the patterned capping layer 301 form the capping mask 401. In some embodiments, the remaining portions of the patterned capping layer 301 extend between the STIs 105 and have a third width W3 of between about 3 nm and about 1 μm, such as about 8 nm. However, any suitable pattern and any suitable widths may be utilized. Although two capping layer openings 403 are illustrated in FIG. 4, it is to be understood that any suitable number of openings may be formed in the capping layer 301 to form the capping mask 401 and to expose any desired portions of the amorphous high-k dielectric layer 211 in preparation for the seeding process, without departing from the spirit of the embodiments disclosed herein.

Once the capping mask 401 has been formed and the portions of the amorphous high-k dielectric layer 211 are exposed through the openings 403, the first hardmask 303 may be removed. The first hardmask 303 may be removed using, e.g., a wet or dry etching process that uses an etchant selective to the material of the first hardmask 303. However, any suitable removal process may also be utilized.

FIG. 4 further illustrates a first section 450 of the layered stack of materials formed over the substrate 107 including an exposed portion of the amorphous high-k dielectric layer 211 through one of the openings 403 of the capping mask 401. The first section 450 is highlighted in FIG. 4 with a dashed outline and is illustrated in greater detail in FIG. 5.

Figure 5:
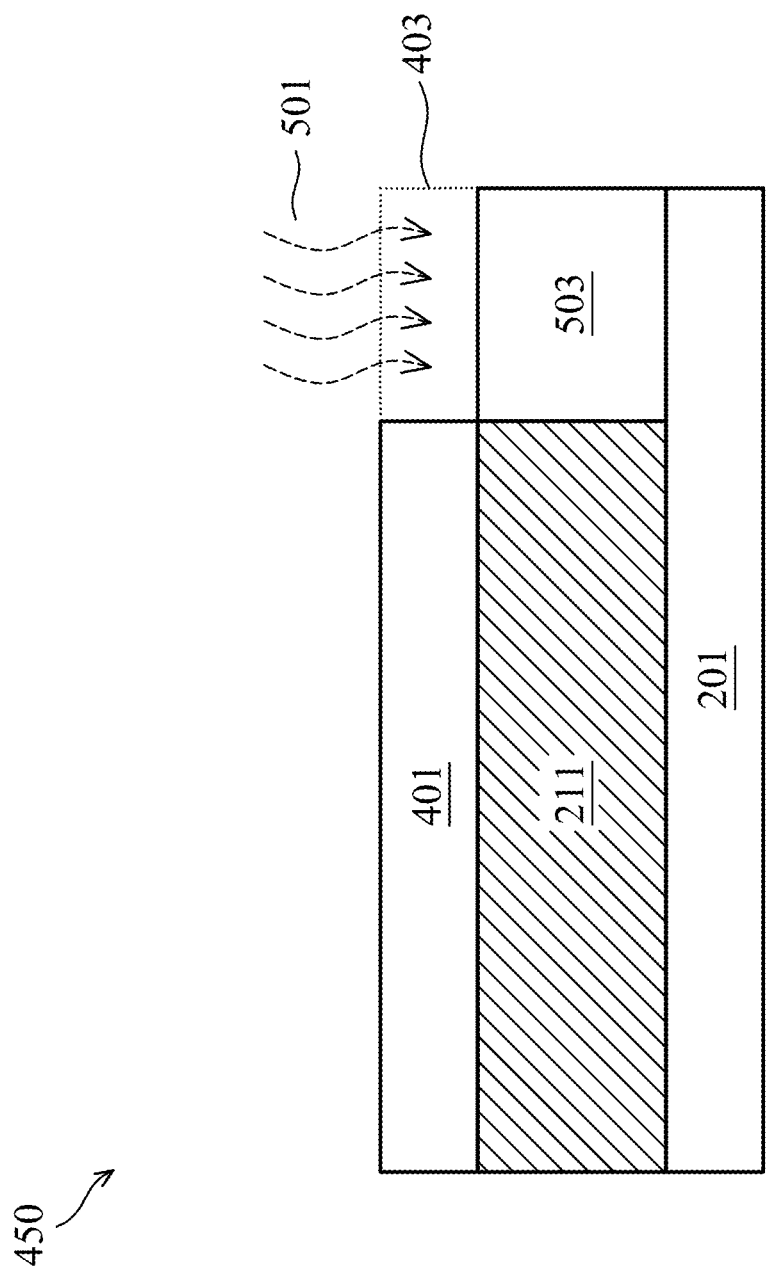

FIG. 5 illustrates the first section 450 of FIG. 4 during an optional seeding process 501 performed on the portions of the amorphous high-k dielectric layer 211 exposed through the openings 403 of the capping mask 401 to form adapted regions 503 in the amorphous high-k dielectric layer 211, according to some embodiments. The seeding process 501 may include performing one or more of an optional nucleation enhancement treatment and/or an optional doping procedure to treat and/or dope the materials of the amorphous high-k dielectric layer 211 in the adapted regions 503 in preparation for a crystallization process to be performed. As such, the seeding process 501 may be performed to boost an ability of the amorphous high-k dielectric layer 211 to crystallize, to control a crystalline phase to be adopted by the amorphous high-k dielectric layer 211, and/or to control a direction of growth of the crystal of the amorphous high-k dielectric layer 211.

In some embodiments, the optional nucleation enhancement treatment includes performing one or more of an inert species implantation (IMP) or an inert plasma using an inert gas (e.g., argon (Ar), helium (He), or the like) to treat the surfaces and the materials of the portions of the amorphous high-k dielectric layer 211 exposed through the openings 403 of the capping mask 401. As such, the optional nucleation enhancement treatment allows for phase control and crystallization enhancement of the adapted regions 503 of the amorphous high-k dielectric layer 211 during a subsequent crystallization process. The optional nucleation enhancement treatment can be directional (e.g., anisotropic) or non-directional (e.g., isotropic). The extent to which the optional nucleation enhancement treatment is performed can affect a number of nucleation sites (e.g., adapted regions 503) and, therefore, at least the phase control and crystallization enhancement for a subsequently performed crystallization process of the amorphous high-k dielectric layer 211, as is described in greater detail below. In some examples, the optional nucleation enhancement treatment can be directional to treat substantially only horizontal surfaces (e.g., a top surface of the amorphous high-k dielectric layer 211 of the planar MOSFET device 100). As such, a direction of the growth of the crystallization of the adapted regions 503 and/or the remaining portions of the amorphous high-k dielectric layer 211 may be controlled during a subsequently performed crystallization process, as is discussed in greater detail below.

In some embodiments, the optional nucleation enhancement treatment may be performed using a beam line implantation of an inert species such as argon (Ar), helium (He) or the like. Implantation energy can be in a range from about 0.5 keV to about 5 keV. A dosage of the implantation can be in a range from about $1\times10^{13}$ cm$^{-2}$ to about $1\times10^{15}$ cm$^{-2}$. The implantation can be to a depth from a respective exposed surface in a range from about 0.5 nm to about 3 nm and to a concentration of the implanted species in a range from about $1\times10^{18}$ cm$^{-3}$ to about $3\times10^{22}$ cm$^{-3}$. The concentration of the species can decrease from a peak proximate to the respective treated surfaces to a depth in the material. The beam line implantation can be directional, although in some examples, multiple implantations may be performed to achieve a more conformal treatment.

In a further example, the optional nucleation enhancement treatment may be performed as a plasma treatment using an inert gas such as argon (Ar), helium (He), or the like. A flow rate of the inert gas can be in a range from about 5 sccm to about 10,000 sccm. A pressure of the plasma treatment can be in a range from about 1 mTorr to about 5 Torr, and a temperature of the plasma treatment can be in a range from about 25° C. to about 600° C. A power of the plasma generator of the plasma treatment can be in a range from about 15 W to about 5,000 W, and a frequency of the plasma generator can be about 13.56 MHz or greater. The substrate during the plasma treatment can be biased in a range from about 0.5 V to about 500 V. The species of the plasma can damage the exposed surfaces and can diffuse into the exposed surfaces of the amorphous high-k dielectric layer 211 to treat the adapted regions 503. The plasma treatment can be conformal or directional. The plasma treatment can cause the species of the plasma to be embedded on the treated surfaces of the amorphous high-k dielectric layer 211 and/or diffused into the materials of the amorphous high-k dielectric layer 211 to a depth below the treated surfaces. For example, the species used for the plasma (e.g., argon (Ar), helium (He), ... etc.) can be diffused into the materials that form the amorphous high-k dielectric layer 211 to a depth of the respective materials from the treated surface equal to or less than about 3 nm and at a concentration in a range from about $1 \times 10^{18}$ cm$^{-3}$ to about $3 \times 10^{22}$ cm$^{-3}$. The concentration of the species can decrease from a peak proximate to the respective treated surfaces to a depth in the material.

In some embodiments, the optional doping procedure is performed on the exposed surfaces of the amorphous high-k dielectric layer 211 using the capping mask 401 as a mask in order to form and/or to further enhance the crystallization properties of the adapted regions 503. As such, a crystallization enhancement and/or phase control of the materials of the adapted regions 503 of the amorphous high-k dielectric layer 211 may be controlled during a subsequent crystallization process.

In some embodiments, dopants such as silicon (Si), yttrium (Y), zirconium (Zr), scandium (Sc), lanthanum (La), aluminum (Al), gadolinium (Gd), and the like or any other suitable materials may be implanted or diffused into the materials of the amorphous high-k dielectric layer 211 in order to reduce the crystallization temperature of the adapted regions 503 (if these materials were not already formed during formation of the amorphous high-k dielectric layer 211). For example, based on the dopant (e.g., zirconium (Zr) or other suitable dopants), a crystallization temperature of the materials of the adapted regions 503 can be reduced by to be between about 450° C. and about 850° C., such as about 700° C. as compared to the crystallization temperature of the materials of the undoped portions of the amorphous high-k dielectric layer 211. Furthermore, crystalline phase change of the amorphous high-k dielectric layer 211 can be controlled. According to some embodiments, based on the composition of the materials and treatments performed on the adapted regions 503 a crystalline phase change of the materials in the adapted regions 503, during a subsequent crystallization process as is described below, can be controlled to adopt one or more desired crystal phases (e.g., tetragonal, cubic, orthorhombic, rhombohedral, and the like).

Figure 6:
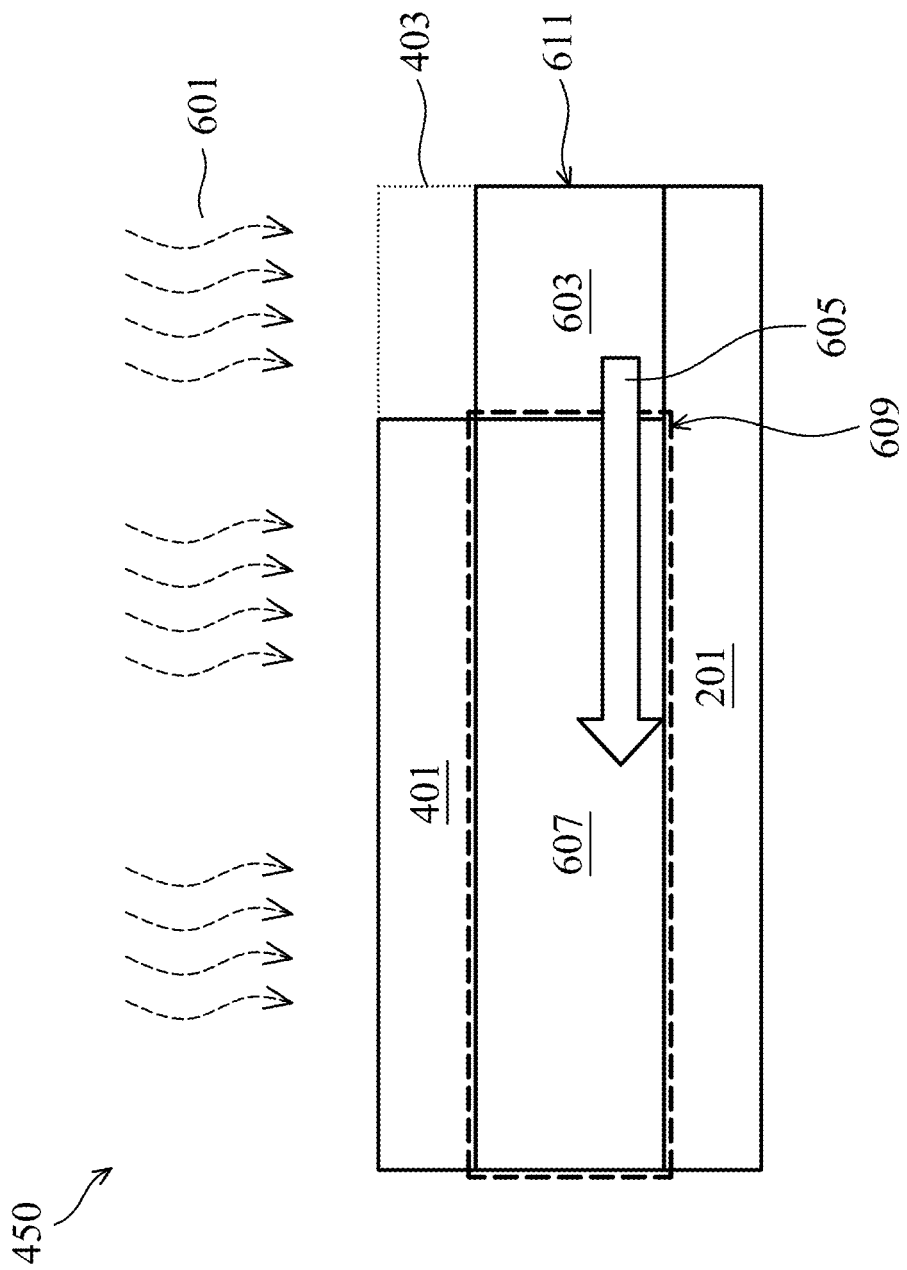

FIG. 6 illustrates the first section 450 undergoing a crystallization process 601 performed on the amorphous high-k dielectric layer 211 to form a crystalline high-k dielectric layer 611 according to some embodiments. The crystallization process 601 includes performing one or more annealing techniques to at least partially crystallize the amorphous high-k dielectric layer 211. During the crystallization process 601, one or more seeding sections 603 (e.g., nucleation sites) are formed first within the adapted regions 503 of the amorphous high-k dielectric layer 211. As the one or more seeding sections 603 are formed, one or more crystalline section interfaces 609 are formed between the one or more seeding sections 603 and the remaining sections of the amorphous high-k dielectric layer 211. The remaining sections of the amorphous high-k dielectric layer 211 serve as growth sections 607 during the crystallization process 601 in order to form the crystalline high-k dielectric layer 611.

In some embodiments, an initial anneal technique of the crystallization process 601 may be performed once the openings 403 are formed to expose the one or more portions of the amorphous high-k dielectric layer 211. In some embodiments, the initial anneal technique of the crystallization process 601 may be performed after the optional nucleation enhancement treatment has been performed and/or after the optional doping procedure has been performed. During the initial anneal process, the capping mask 401 acts as a crystallization barrier for those portions of the amorphous high-k dielectric layer 211 protected by the capping mask 401; meanwhile the openings 403 provide a reduced barrier to crystallization for the one or more seeding sections 603. According to some embodiments, the crystallization process 601 may continue the initial anneal technique until the seeding sections 603 are fully crystallized.

Furthermore, based on the materials of the amorphous high-k dielectric layer 211 and based on any optional nucleation enhancement treatments and/or any optional dopants implanted therein during the seeding process 501, process controls (e.g., temperature, pressure, duration, and/or ambient) of the initial anneal technique of the crystallization process 601 may be controlled to remain within respective morphotropic phase boundaries of a crystalline phase of the materials of the seeding sections 603 during crystallization. As such, the materials of the amorphous high-k dielectric layer 211 in the seeding sections 603 are crystallized to have desired first crystalline phases, first crystalline orientations and first crystalline grain sizes. Accordingly, a desired first set of physical properties of the amorphous high-k dielectric layer 211 in the seeding sections 603 can be modified to provide desired first k values (i.e., relative permittivity), to provide desired first ferroelectric properties, to provide desired first directions of crystal growth, and/or to provide desired first grain sizes of the crystals formed therein.

According to some embodiments, the initial anneal technique is controlled such that the seeding sections 603 are crystallized to have a desired crystal phase such as tetragonal, cubic, or orthorhombic in order to help modify the properties of the seeding sections 603 and, eventually, the crystalline high-k dielectric layer 611. For example, by modifying the crystalline high-k dielectric layer 611 to either a tetragonal or cubic phase, the k-value of the crystalline high-k dielectric layer 611 may be increased. Similarly, by modifying the crystalline high-k dielectric layer 611, the ferroelectric property of the crystalline high-k dielectric layer 611 may be modified.

For example, in embodiments in which a tetragonal phase is desired, the amorphous high-k dielectric layer 211 may be doped with a doping agent (e.g., Zr, Si, N, etc.) and/or treated with plasma and the initial anneal may be performed at a temperature of between about 750° C. and about 1,200° C. for a time of between about 1 ms and about 30 sec. As such, the seeding sections 603 are provided with an increased k value as compared to the amorphous matrix material of the amorphous high-k dielectric layer 211 alone. For example, the seeding sections 603 when crystallized to have a tetragonal phase may have a k value of between about 25 and about 70, such as about 40. However, any suitable percentage increase in k values may be utilized.

In another embodiment in which a cubic phase is desired, the amorphous high-k dielectric layer 211 may be doped with a doping agent (e.g., Y, La, Al, etc.) and/or treated with plasma and the initial anneal may be performed at a temperature of between about 750° C. and about 1,200° C. for a time of between about 0.1 ms and about 30 sec. As such, the seeding sections 603 when crystallized to have a cubic phase may have k values of between about 25 and about 45, such as about 35. However, any suitable percentage increase in k values may be utilized.

In yet another embodiment in which an orthorhombic phase is desired, the amorphous high-k dielectric layer 211 may be doped with a doping agent (e.g., Zr, La, Y, Al, Si, N, etc.) and/or treated with plasma and the initial anneal may be performed at a temperature of between about 600° C. and about 1,200° C. for a time of between about 1 ms and about 30 sec. As such, the seeding sections 603 when crystallized to have an orthorhombic phase may have an increased ferroelectric property, such as spontaneous polarization, remanent polarization, polarization coercivity, and/or increased polarization retentivity. For example, in embodiments in which the seeding sections 603 and/or growth sections 607 have an orthorhombic phase, the seeding sections 603 and/or growth sections 607 may have a polarization coercivity of between about 1 MV/cm and about 2 MV/cm, such as about 1.5 MV/cm and may have a remanent polarization in the range of 0.2 uC/cm$^2$ to 50 uC/cm$^2$. However, any suitable ferroelectric properties may be utilized.

In some embodiments, the initial anneal technique is controlled such that the seeding sections 603 are crystallized to have a desired orientation (e.g., direction of crystal growth). For example, in some embodiments, the seeding sections 603 are crystallized to have a direction of crystal growth that is substantially perpendicular to the exposed surfaces of the seeding sections 603. In other embodiments, the seeding sections 603 are crystallized to have a direction of crystal growth that is substantially parallel to the exposed surfaces of the seeding sections 603. However, any suitable orientation may be utilized.

In some embodiments, the initial anneal technique is controlled such that the seeding sections 603 are crystallized to have desired first crystalline grain sizes. In some embodiments, the seeding sections 603 are crystallized to have first crystalline grain sizes of between about 30 Å and about 2,000 Å, such as about 100 Å. However, any suitable grain size may be utilized.

According to some embodiments, the initial anneal technique of the crystallization process 601 may be performed as a low-temperature soak anneal, a high-temperature spike anneal process, a spike anneal process, combinations thereof, or the like. The low-temperature soak anneal process may be performed at a temperature below about 700° C., such as about 500° C. for a period of between about 5 sec and about 1,800 sec, such as about 300 sec. In other embodiments, the high-temperature spike anneal process may be performed at a temperature above about 800° C., such as about 1,100° C. for a period of less than about 100 ms, such as about 3 ms. In still other embodiments, the spike anneal process may be performed at a temperature of between about 700° C. and about 1,000° C., such as about 850° C. for a period of greater than 0.5 sec, such as about 1.5 sec. However, any suitable anneal processes, any suitable temperatures, any suitable periods, and any suitable combinations thereof may be used to perform the initial anneal technique of the crystallization process 601.

According to some embodiments, the materials of the amorphous high-k dielectric layer 211 corresponding to the growth sections 607 may remain in an amorphous material state upon completion of the initial anneal technique due to the barrier to crystallization provided by the capping mask 401, as discussed above. In other embodiments, however, crystal nucleation regions may begin to form within the amorphous material of the growth sections 607 prior to completion of the initial anneal technique and prior to the seeding sections 603 being fully crystalized. Nevertheless, in these other embodiments, during the initial anneal technique the capping mask 401 serves as a barrier to crystallization for the growth sections 607. As such, the extent of crystallization of the amorphous matrix of the amorphous high-k dielectric layer 211 of the growth sections 607 is to a lesser extent than that of the amorphous matrix of the amorphous high-k dielectric layer 211 of the seeding sections 603. For example, during the initial anneal process of the crystallization process 601, the crystallization area ratio of the growth sections 607 is less than the crystallization area ratio of the seeding sections 603.

FIG. 6 further illustrates, during one or more subsequent anneal techniques performed for the crystallization process 601, the process is controlled such that the materials of the amorphous high-k dielectric layer 211 in the growth sections 607 are crystallized to have desired second crystalline phases, second crystalline orientations and second crystalline grain sizes. Accordingly, a desired second set of physical properties of the amorphous high-k dielectric layer 211 in the growth sections 607 can be modified to provide desired second k values (e.g., relative permittivity), to provide desired second ferroelectric properties, to provide desired second directions of crystal growth, and/or to provide desired second grain sizes of the crystals formed therein. In some embodiments, the one or more subsequent anneal techniques are controlled such that the desired second set of physical properties of the amorphous high-k dielectric layer 211 in the crystallization growth sections are the same as the desired second set of physical properties of the amorphous high-k dielectric layer 211 in the seeding sections 603. However, in other embodiments, the desired first set of physical properties of the seeding sections 603 may be different from the second set of physical properties of the growth sections 607 (from, e.g., different doping profiles, compositions, or the like).

During the one or more subsequent anneal techniques of the crystallization process 601, the crystalline growth of the materials in the growth sections 607 are controlled to originate from one or more crystalline section interfaces 609 of the seeding sections 603. As such, the growth sections 607 are further controlled to adopt crystallization directions 605 (e.g., the orientation of the growth of crystallization) with crystal growth forming in a uniaxial direction (to form a uniaxial crystal orientation) between the capping mask 401 and the surface of material underlying the growth sections 607 (e.g., the optional interfacial layer 201) in a direction facing away from the one or more crystalline section interfaces 609 of the seeding sections 603. Therefore, the barrier to crystallization of the capping mask 401 in the growth sections 607 is overcome by nucleation and location of the growth sections 607 originating from the interfaces 609 of the seeding sections 603. As such, the phase and orientation of the crystalline growth in the growth sections 607 may be controlled even for embodiments in which ultrathin films (e.g., films that have a thickness of less than about 3 nm, such as less than about 2 nm) are used for the amorphous high-k dielectric layer 211.

In some embodiments, the crystallization process 601 is controlled such that the seeding sections 603 are crystallized to have desired first crystalline grain sizes and the growth sections 607 are crystallized to have desired second crystalline grain sizes that are the same as the first grain sizes. However, in other embodiments, the first grain size and the second grain size may be different. According to some embodiments, the seeding sections 603 and the growth sections 607 are crystallized to have crystalline grain sizes of between about 30 Å and about 2,000 Å, such as about 100 Å. However, any suitable grain size may be utilized.

Furthermore, the growth sections 607 may be fully crystallized by the crystallization process 601 according to some embodiments. In other embodiments, the growth sections 607 may be partially crystallized by the crystallization process 601. The partial crystallization of the growth sections 607 may be formed such that a portion of the growth section 607 adjacent to the seeding sections 603 is crystallized while a portion removed from the seeding sections 603 remains amorphous.

According to some embodiments, the one or more subsequent anneal techniques performed during the crystallization process 601 to crystallize the growth sections 607 include, but are not limited to spike anneal processes, low-temperature soak anneal process, high-temperature spike anneal process, combinations of these, and the like, depending upon the desired phase (as described above). For example, a spike anneal may be performed at a temperature between about 700° C. and about 1000° C., such as about 850° C. for a period of greater than about 0.5 sec, such as about 1.5 sec. However, any suitable temperatures and any suitable periods may be used to perform the one or more subsequent anneal techniques of the crystallization process 601.

Figure 7:
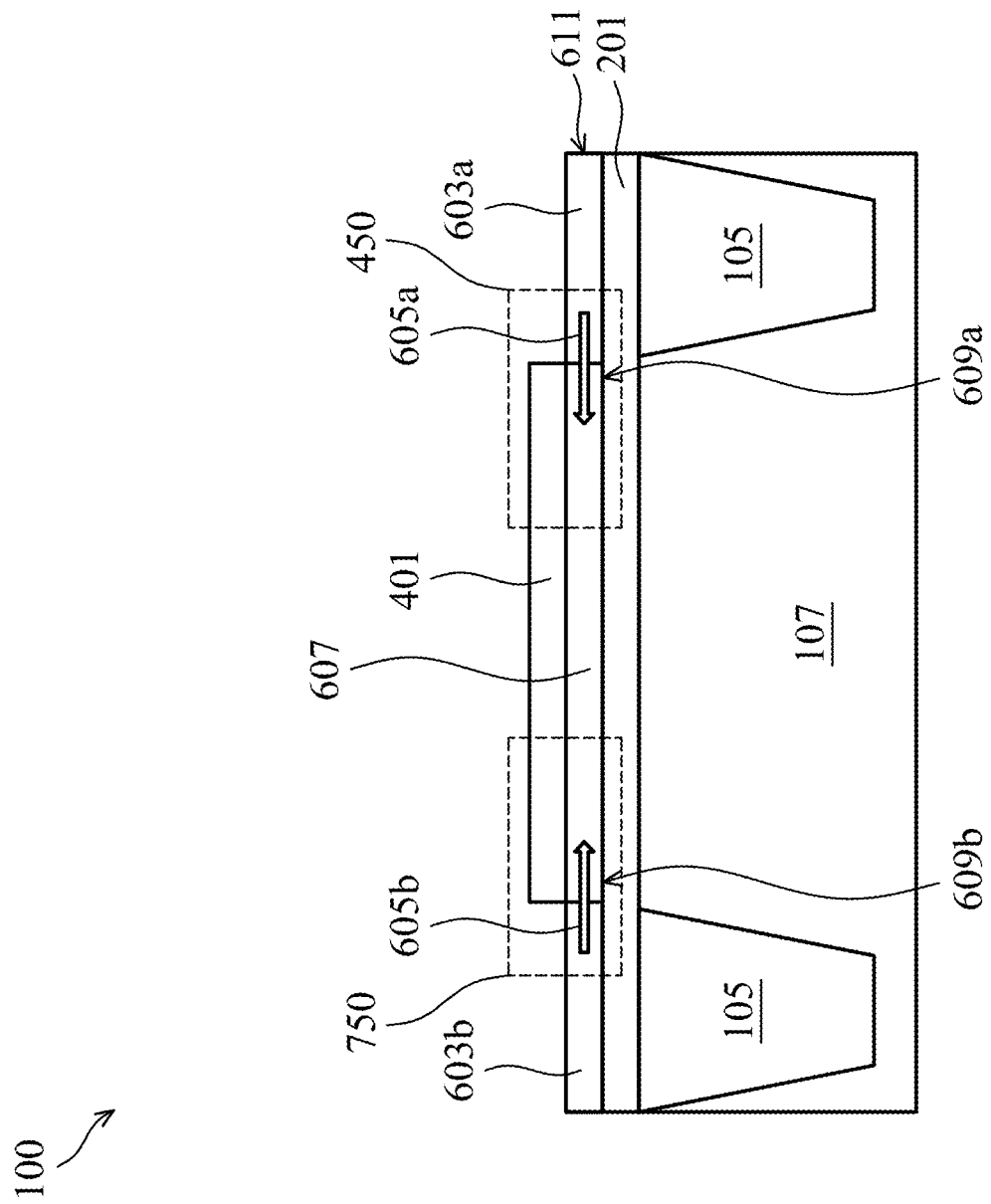

FIG. 7 illustrates, according to some embodiments, the MOSFET device 100 comprising the crystalline high-k dielectric layer 611 formed from the amorphous high-k dielectric layer 211 during the crystallization process 601 of FIG. 6. In particular, FIG. 7 illustrates the first section 450 having undergone the crystallization process 601 to form the crystalline high-k dielectric layer 611 and further illustrates a second section 750 also having undergone the crystallization process 601 during formation of the crystalline high-k dielectric layer 611. The first section 450 includes a first seeding section 603a with an exposed surface, a first interface 609a disposed between the first seeding section 603a and the growth section 607 having a first direction of growth 605a, the growth section 607 being disposed between the capping mask 401 and the optional interfacial layer 201. The second section 750 includes a second seeding section 603b with an exposed surface, a second interface 609b disposed between the second seeding section 603b and the growth section 607 having a second direction of growth 605b, the second direction of growth 605b being substantially opposite the first direction of growth 605a.

According to some embodiments, the desired phase of the crystalline growth of the second direction of growth 605b may be matched to the desired phase of the crystalline growth of the first direction of growth 605a. In other embodiments, the desired phase of the crystalline growth of the second direction of growth 605b may be different from the desired phase of the crystalline growth of the first direction of growth 605a. In still other embodiments, the phase of the crystalline growth of the first direction of growth 605a may be formed with a desired first gradient and the phase of the crystalline growth of the second direction of growth 605b may be formed with a desired second gradient. For example, the phase of the crystalline growth in the first direction of growth 605a may be formed with a desired first gradient starting from the first seeding section 603a having a first crystalline phase (e.g., tetragonal), the growth section 607 having a second crystalline phase (e.g., cubic) starting at the first interface 609a and transitioning to a third crystalline phase (e.g., orthorhombic) at the center of the growth section 607. As a further example, the phase of the crystalline growth in the second direction of growth 605b may be formed with a desired second gradient starting from the second seeding section 603b having a first crystalline phase (e.g., tetragonal), the growth section 607 having a second crystalline phase (e.g., cubic) starting at the second interface 609b and transitioning to a third crystalline phase (e.g., orthorhombic) at the center of the growth section 607.

Figure 8:
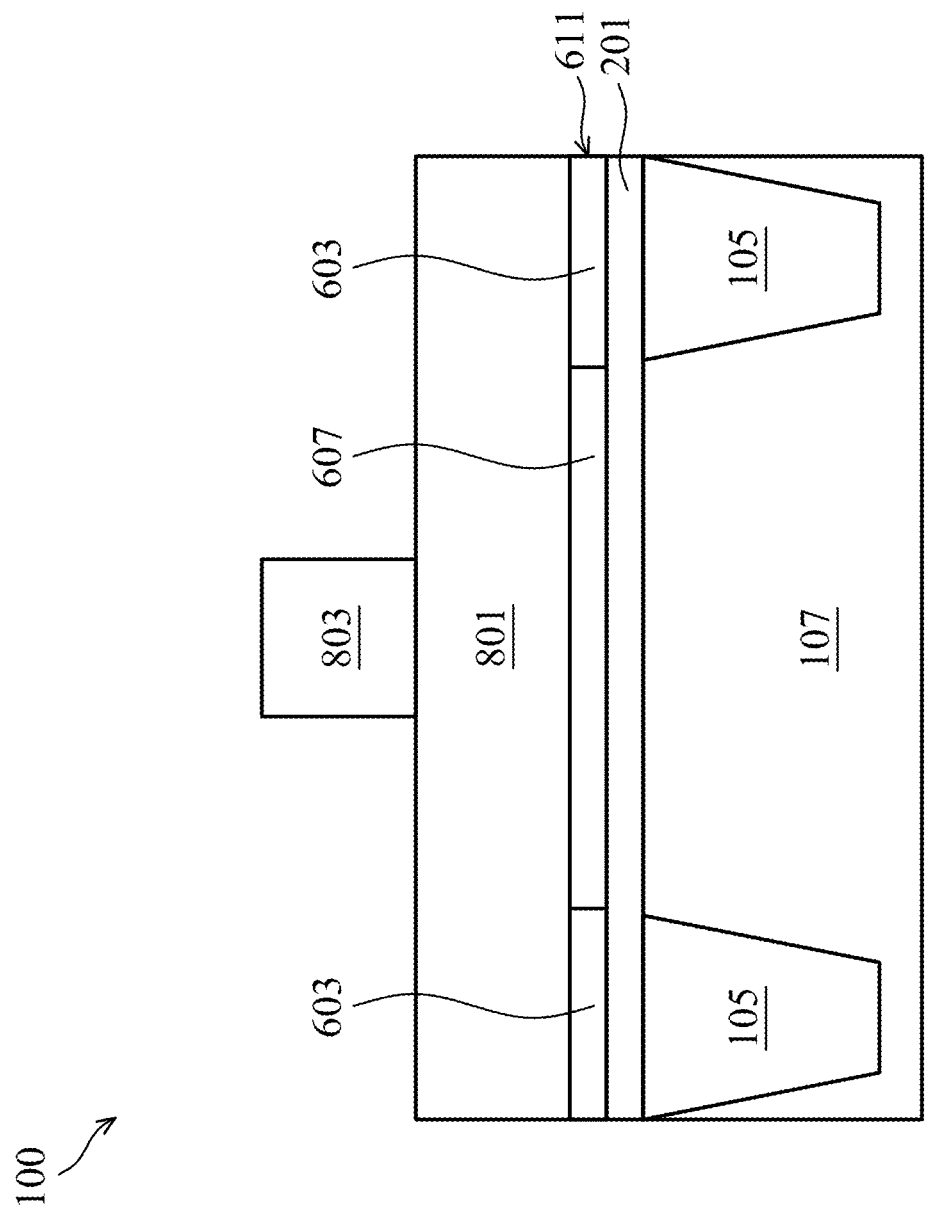

FIG. 8 illustrates the formation of a gate electrode layer 801 over the crystalline high-k dielectric layer 611. The gate electrode layer 801 preferably comprises a conductive material, such as polysilicon, a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. According to some embodiments, the gate electrode layer 801 is formed via a physical vapor deposition (PVD) or a chemical vapor deposition (CVD) to have a thickness of between about 100 Å and about 2,500 Å, such as about 600 Å.

According to some embodiments, an optional adhesion layer may be formed between the crystalline high-k dielectric layer 611 and the gate electrode layer 801. The optional adhesion layer may be formed via a thermal deposition using a chemical vapor deposition (CVD) (e.g., atomic layer deposition (ALD), low pressure chemical vapor deposition (LPCVD) or plasma enhanced chemical vapor deposition (PECVD)) to deposit a silicon-rich thin film that is subjected to an oxidation or nitridation process.

FIG. 8 further illustrates the deposition and patterning of a photoresist layer 803 over the gate electrode layer 801 as intermediate steps in the process of forming the MOSFET device 100 in accordance with some embodiments. In an embodiment the photoresist layer 803 may be exposed and developed according to a desired pattern in photoresist layer 803 (e.g., the desired size and shape of the gate stack 901).

Figure 9:
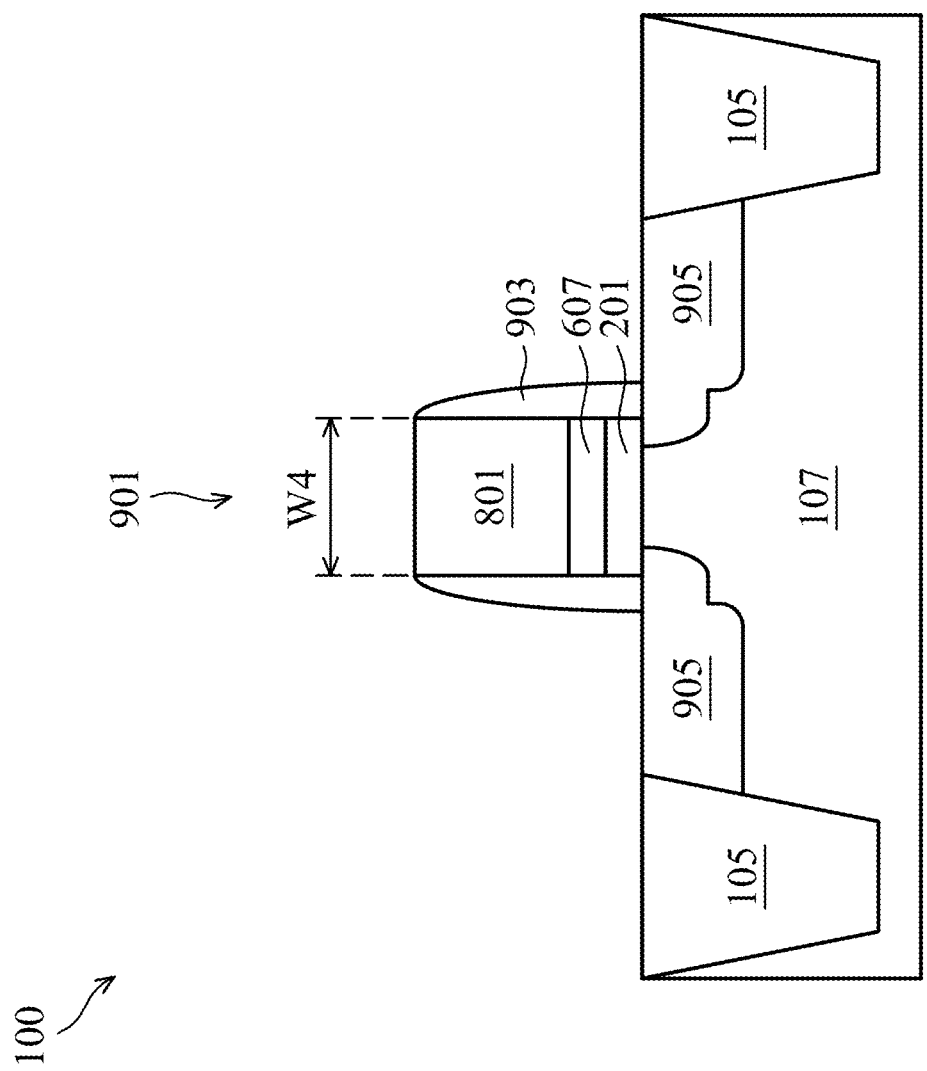

FIG. 9 illustrates the formation of a gate stack 901 from the gate electrode layer 801, the growth section 607 of the crystalline high-k dielectric layer 611, the optional silicon-rich film (if formed) between the gate electrode layer 801 and the crystalline high-k dielectric layer 611, and (if formed) the optional interfacial layer 201. The gate stack 901 is formed by the removal of the materials not covered by the patterned photoresist layer 803 illustrated in FIG. 8. According to some embodiments, the gate stack 901 is formed to a fourth width W4 of between about 3 nm and about 1,000 nm, such as about 16 nm. However, any suitable width may be used.

FIG. 9 further illustrates the formation of spacers 903 and source/drain regions 905 in order to complete the formation of the MOSFET device 100. The spacers 903 are formed on the sidewalls of the gate stack 901. Source/drain regions 905 are formed in the substrate 107 on opposing sides of the gate stack 901.

Once the gate stack 901 has been formed and the substrate 107 is substantially exposed, the spacers 903 are formed by blanket depositing a spacer layer (not shown) over the gate stack 901 and over exposed surfaces of the substrate 107, according to some embodiments. The spacer layer comprises SiN, oxynitride, SiC, SiON, oxide, and the like, and is preferably formed by commonly used methods such as chemical vapor deposition (CVD), plasma enhanced chemical vapor deposition (PECVD), sputtering, or the like. The spacer layer is then patterned to form the spacers 903 by anisotropically etching to remove the spacer layer from the horizontal surfaces of the gate stack 901 and the substrate 107.

In an embodiment in which the substrate is an n-type substrate, the source/drain regions 905 are formed by implanting appropriate p-type dopants such as boron, gallium, indium, or the like. These source/drain regions 905 are implanted using the gate stack 901 and the gate spacers 903 as masks.

It should be noted that one of ordinary skill in the art will realize that many other processes, steps, or the like may be used to form these source/drain regions 905. For example, one of ordinary skill in the art will realize that a plurality of implants may be performed using various combinations of spacers and liners to form source/drain regions 905 having a specific shape or characteristic suitable for a particular purpose. Any of these processes may be used to form the source/drain regions 905, and the above description is not meant to limit the present invention to the steps presented above.

By utilizing a capping layer to modify and control the crystallization to form the crystalline high-k dielectric layer 611, the crystallinity can be improved to form an improved ultrathin crystalline film. Additionally, by controlling the crystal phase of the crystalline high-k dielectric layer 611, more favorable properties for the crystalline high-k dielectric layer 611 can be obtained.

Figure 10:
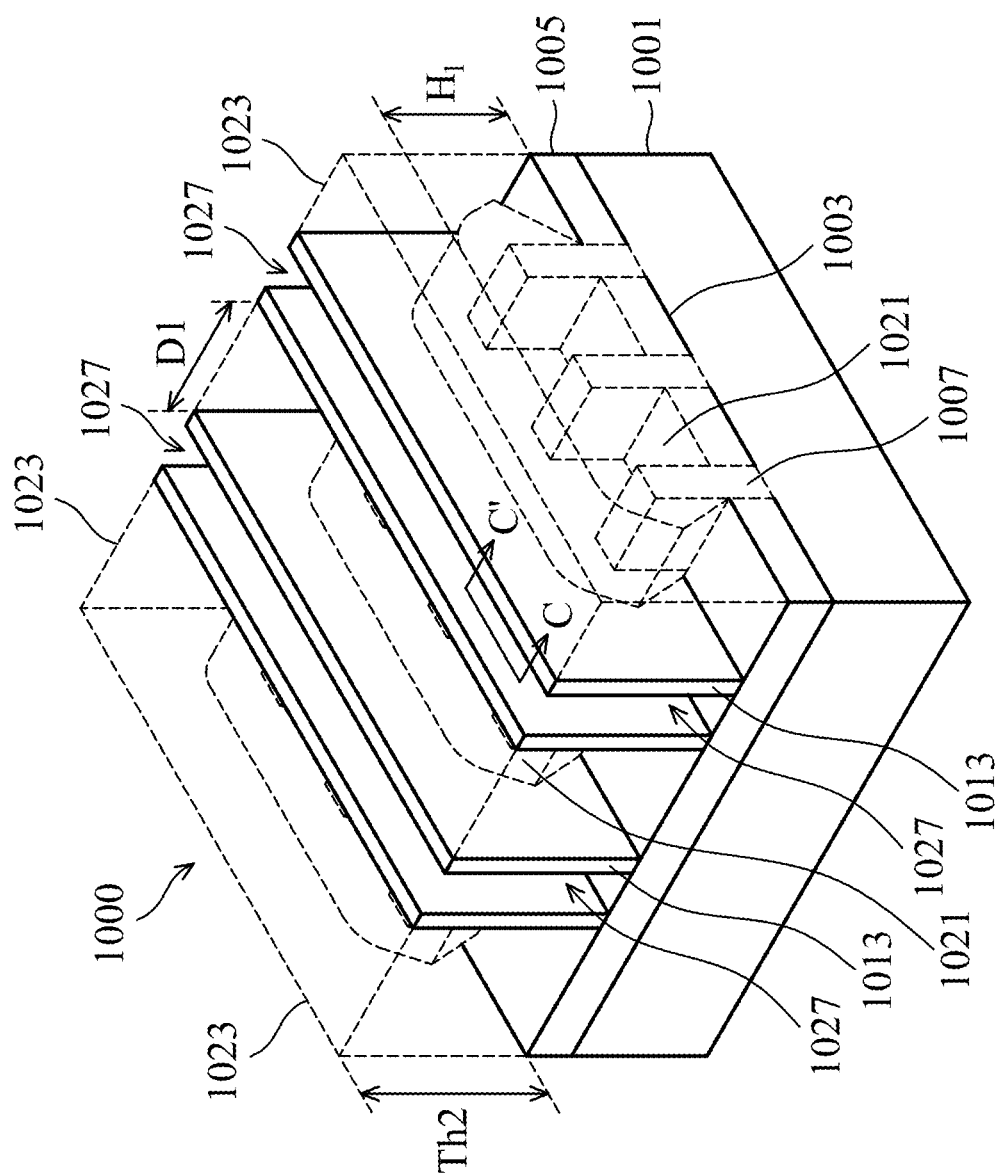
FIGS. 10-17 illustrates steps in a process of forming a fin field effect transistor (finFET) device in accordance with some embodiments.

With reference now to FIG. 10, there is illustrated a perspective view of a semiconductor device such as a finFET device 1000. In an embodiment the finFET device 1000 comprises a substrate 1001 with first trenches 1003 formed therein. The substrate 1001 may be a silicon substrate, although other substrates, such as semiconductor-on-insulator (SOI), strained SOI, and silicon germanium on insulator, could be used. The substrate 1001 may be a p-type semiconductor, although in other embodiments, it could be an n-type semiconductor.

The first trenches 1003 may be formed as an initial step in the eventual formation of first isolation regions 1005. The first trenches 1003 may be formed using a masking layer (not separately illustrated in FIG. 10) along with a suitable etching process. For example, the masking layer may be a hardmask comprising silicon nitride formed through a process such as chemical vapor deposition (CVD), although other materials, such as oxides, oxynitrides, silicon carbide, combinations of these, or the like, and other processes, such as plasma enhanced chemical vapor deposition (PECVD), low pressure chemical vapor deposition (LPCVD), or even silicon oxide formation followed by nitridation, may be utilized. Once formed, the masking layer may be patterned through a suitable photolithographic process to expose those portions of the substrate 1001 that will be removed to form the first trenches 1003.

As one of skill in the art will recognize, however, the processes and materials described above to form the masking layer are not the only method that may be used to protect portions of the substrate 1001 while exposing other portions of the substrate 1001 for the formation of the first trenches 1003. Any suitable process, such as a patterned and developed photoresist, may be utilized to expose portions of the substrate 1001 to be removed to form the first trenches 1003. All such methods are fully intended to be included in the scope of the present embodiments.

Once a masking layer has been formed and patterned, the first trenches 1003 are formed in the substrate 1001. The exposed substrate 1001 may be removed through a suitable process such as reactive ion etching (RIE) in order to form the first trenches 1003 in the substrate 1001, although any suitable process may be used. In an embodiment, the first trenches 1003 may be formed to have a first depth of less than about 5,000 Å from the surface of the substrate 1001, such as about 2,500 Å.

However, as one of ordinary skill in the art will recognize, the process described above to form the first trenches 1003 is merely one potential process, and is not meant to be the only embodiment. Rather, any suitable process through which the first trenches 1003 may be formed may be utilized and any suitable process, including any number of masking and removal steps may be used.

In addition to forming the first trenches 1003, the masking and etching process additionally form fins 1007 from those portions of the substrate 1001 that remain unremoved. For convenience the fins 1007 have been illustrated in the figures as being separate from the substrate 1001 by a dashed line and by a different pattern, although a physical indication of the separation may or may not be present. These fins 1007 may be used, as discussed below, to form the channel region of multiple-gate FinFET transistors. While FIG. 10 only illustrates three fins 1007 formed from the substrate 1001, any number of fins 1007 may be utilized.

The fins 1007 may be formed such that they have a width at the surface of the substrate 1001 of between about 5 nm and about 80 nm, such as about 30 nm. Additionally, the fins 1007 may be spaced apart from each other by a distance of between about 10 nm and about 100 nm, such as about 50 nm. By spacing the fins 1007 in such a fashion, the fins 1007 may each form a separate channel region while still being close enough to share a common gate.

Furthermore, the fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Once the first trenches 1003 and the fins 1007 have been formed, the first trenches 1003 may be filled with a dielectric material and the dielectric material may be recessed within the first trenches 1003 to form the first isolation regions 1005. The dielectric material may be an oxide material, a high-density plasma (HDP) oxide, or the like. The dielectric material may be formed, after an optional cleaning and lining of the first trenches 1003, using either a chemical vapor deposition (CVD) method (e.g., the HARP process), a high density plasma CVD method, or other suitable method of formation as is known in the art.

The first trenches 1003 may be filled by overfilling the first trenches 1003 and the substrate 1001 with the dielectric material and then removing the excess material outside of the first trenches 1003 and the fins 1007 through a suitable process such as chemical mechanical polishing (CMP), an etch, a combination of these, or the like. In an embodiment, the removal process removes any dielectric material that is located over the fins 1007 as well, so that the removal of the dielectric material will expose the surface of the fins 1007 to further processing steps.

Once the first trenches 1003 have been filled with the dielectric material, the dielectric material may then be recessed away from the surface of the fins 1007. The recessing may be performed to expose at least a portion of the sidewalls of the fins 1007 adjacent to the top surface of the fins 1007. The dielectric material may be recessed using a wet etch by dipping the top surface of the fins 1007 into an etchant such as HF, although other etchants, such as $H_2$, and other methods, such as a reactive ion etch, a dry etch with etchants such as $NH_3/NF_3$, chemical oxide removal, or a dry chemical clean may be used. The dielectric material may be recessed to a distance from the surface of the fins 1007 of between about 50 Å and about 500 Å, such as about 400 Å. Additionally, the recessing may also remove any leftover dielectric material located over the fins 1007 to ensure that the fins 1007 are exposed for further processing.

As one of ordinary skill in the art will recognize, however, the steps described above may be only part of the overall process flow used to fill and recess the dielectric material. For example, lining steps, cleaning steps, annealing steps, gap filling steps, combinations of these, and the like may also be utilized to form and fill the first trenches 1003 with the dielectric material. All of the potential process steps are fully intended to be included within the scope of the present embodiment.

After the first isolation regions 1005 have been formed, dummy gate dielectrics, dummy gate electrodes formed over the dummy gate dielectrics, and first spacers 1013 may be formed over each of the fins 1007. In an embodiment the dummy gate dielectrics may be formed by thermal oxidation, chemical vapor deposition, sputtering, or any other methods known and used in the art for forming a gate dielectric. Depending on the technique of gate dielectric formation, the dummy gate dielectrics thickness on the top of the fins 1007 may be different from the gate dielectric thickness on the sidewall of the fins 1007.

The dummy gate dielectrics may comprise a material such as silicon dioxide or silicon oxynitride with a thickness ranging from about 3 angstroms to about 100 angstroms, such as about 10 angstroms. The dummy gate dielectrics may be formed from a high permittivity (high-k) material (e.g., with a relative permittivity greater than about 5) such as lanthanum oxide ($La_2O_3$), aluminum oxide ($Al_2O_3$), hafnium oxide ($HfO_2$), hafnium oxynitride (HfON), or zirconium oxide ($ZrO_2$), or combinations thereof, with an equivalent oxide thickness of about 0.5 angstroms to about 100 angstroms, such as about 10 angstroms or less. Additionally, any combination of silicon dioxide, silicon oxynitride, and/or high-k materials may also be used for the dummy gate dielectrics.

The dummy gate electrodes may comprise a conductive material and may be selected from a group comprising of W, Al, Cu, AlCu, W, Ti, TiAlN, TaC, TaCN, TaSiN, Mn, Zr, TiN, Ta, TaN, Co, Ni, combinations of these, or the like. The dummy gate electrodes may be deposited by chemical vapor deposition (CVD), sputter deposition, or other techniques known and used in the art for depositing conductive materials. The thickness of the dummy gate electrodes may be in the range of about 5 Å to about 200 Å. The top surface of the dummy gate electrodes may have a non-planar top surface, and may be planarized prior to patterning of the dummy gate electrodes or gate etch. Ions may or may not be introduced into the dummy gate electrodes at this point. Ions may be introduced, for example, by ion implantation techniques.

Once formed, the dummy gate dielectrics and the dummy gate electrodes may be patterned to form a series of dummy stacks over the fins 1007. The dummy stacks define multiple channel regions located on each side of the fins 1007 beneath the dummy gate dielectrics. The dummy stacks may be formed by depositing and patterning a gate mask (not separately illustrated in FIG. 10) on the dummy gate electrodes using, for example, deposition and photolithography techniques known in the art. The gate mask may incorporate commonly used masking and sacrificial materials, such as (but not limited to) silicon oxide, silicon oxynitride, SiCON, SiC, SiOC, and/or silicon nitride and may be deposited to a thickness of between about 5 Å and about 200 Å. The dummy gate electrodes and the dummy gate dielectrics may be etched using a dry etching process to form the patterned dummy stacks.

Once the dummy stacks have been patterned, the first spacers 1013 may be formed. The first spacers 1013 may be formed on opposing sides of the dummy stacks. The first spacers 1013 are typically formed by blanket depositing a spacer layer (not separately illustrated in FIG. 10) on the previously formed structure. The spacer layer may comprise SiN, oxynitride, SiC, SiON, SiOCN, SiOC, oxide, and the like and may be formed by methods utilized to form such a layer, such as chemical vapor deposition (CVD), plasma enhanced CVD, sputter, and other methods known in the art. The spacer layer may comprise a different material with different etch characteristics or the same material as the dielectric material within the first isolation regions 1005. The first spacers 1013 may then be patterned, such as by one or more etches to remove the spacer layer from the horizontal surfaces of the structure, to form the first spacers 1013.

In an embodiment the first spacers 1013 may be formed to have a first thickness T1 of between about 5 Å and about 500 Å, such as about 50 Å. Additionally, once the first spacers 1013 have been formed, a first spacer 1013 adjacent to one of the dummy stacks may be separated from a first spacer 1013 adjacent to another one of the dummy stacks by a first distance D1 of between about 5 nm and about 200 nm, such as about 20 nm. However, any suitable thicknesses and distances may be utilized.

FIG. 10 further illustrates a formation of source/drain regions 1021 of the finFET device 1000 and a removal of the dummy stacks to form openings 1027 between the first spacers 1013 and to expose the fins 1007 within channel regions of the finFET device 1000 for further processing to be performed.

According to some embodiments, while the portions of the fins 1007 in the channel regions are protected by the dummy stacks and by the first spacers 1013, the remaining portions of the fins 1007 are unprotected and are removed. Once the remaining portions of the fins 1007 are removed, source/drain regions 1021 are regrown. The removal of the fins 1007 from the unprotected areas may be performed by a reactive ion etch (RIE) using the dummy stacks and the first spacers 1013 as hardmasks to protect the channel regions of the fins 1007, or by any other suitable removal process. The removal may be continued until the fins 1007 are either planar with or below the surface of the first isolation regions 1005.

Once the remaining portions of the fins 1007 have been removed from the unprotected areas, a hard mask is placed and patterned to cover the dummy gate electrodes to prevent growth of the dummy gate electrodes. As such, the source/drain regions 1021 may be regrown in contact with each of the fins 1007 in the channel regions located underneath the dummy stacks. In an embodiment the source/drain regions 1021 may be regrown and, in some embodiments the source/ drain regions 1021 may be regrown to form a stressor that will impart a stress to the channel regions of the fins 1007 located underneath the dummy stacks. In an embodiment wherein the fins 1007 comprise silicon and the FinFET is a p-type device, the source/drain regions 1021 may be regrown through a selective epitaxial process with a material, such as silicon or else a material such as silicon germanium that has a different lattice constant than the channel regions. In other embodiments, the source/drain regions 1021 may comprise materials such as GaAs, GaP, GaN, InP, InAs, InSb, GaAsP, AlGaN, AlInAs, AlGaAs, GaInAs, GaInP, GaInAsP, combinations of these, or the like. The epitaxial growth process may use precursors such as silane, dichlorosilane, germane, and the like, and may continue for between about 5 minutes and about 120 minutes, such as about 30 minutes.

In an embodiment the source/drain regions 1021 may be formed to have a thickness of between about 5 Å and about 1000 Å, and may have a first height H1 over the first isolation regions 1005 of between about 10 Å and about 500 Å, such as about 200 Å. However, any suitable height may be utilized.

Once the source/drain regions 1021 are formed, dopants may be implanted into the source/drain regions 1021 by implanting appropriate dopants to complement the dopants in the fins 1007 in the channel regions located underneath the dummy stacks. For example, p-type dopants such as boron, gallium, indium, or the like may be implanted to form a PMOS device. Alternatively, n-type dopants such as phosphorous, arsenic, antimony, or the like may be implanted to form an NMOS device. These dopants may be implanted using the dummy stacks and the first spacers 1013 as masks. It should be noted that one of ordinary skill in the art will realize that many other processes, steps, or the like may be used to implant the dopants. For example, one of ordinary skill in the art will realize that a plurality of implants may be performed using various combinations of spacers and liners to form source/drain regions having a specific shape or characteristic suitable for a particular purpose. Any of these processes may be used to implant the dopants, and the above description is not meant to limit the present invention to the steps presented above.

Additionally at this point the hard mask that covered the dummy gate electrodes during the formation of the source/drain regions 1021 is removed. In an embodiment the hard mask may be removed using, e.g., a wet or dry etching process that is selective to the material of the hard mask. However, any suitable removal process may be utilized.

FIG. 10 also illustrates a formation of an inter-layer dielectric (ILD) layer 1023 (illustrated in dashed lines in FIG. 10 in order to more clearly illustrate the underlying structures) over the dummy stacks and over the source/drain regions 1021. The ILD layer 1023 may comprise a material such as boron phosphorous silicate glass (BPSG), although any suitable dielectrics may be used. The ILD layer 1023 may be formed using a process such as PECVD, although other processes, such as LPCVD, may alternatively be used. The ILD layer 1023 may be formed to a thickness T2 of between about 100 Å and about 3,000 Å. Once formed, the ILD layer 1023 may be planarized with the dummy stacks and the first spacers 1013 using, e.g., a planarization process such as chemical mechanical polishing process, although any suitable process may be utilized.

After the formation of the ILD layer 1023, the materials of the dummy gate electrodes and the dummy gate dielectrics of the dummy stacks may be removed to provide openings 1027 between the first spacers 1013 and to expose the fins 1007 within the channel regions of the finFET device 1000. In an embodiment the dummy gate electrodes and the dummy gate dielectrics may be removed using, e.g., one or more wet or dry etching processes that utilize etchants that are selective to the materials of the dummy gate electrodes and the dummy gate dielectrics of the dummy stacks. However, any suitable removal process may be utilized. Once the dummy gate electrodes and the dummy gate dielectrics of the dummy stacks have been removed, the openings 1027 left behind may be used to form metal gate stack structures therein; the metal gate stack structures are discussed in greater detail below.

Figure 11:
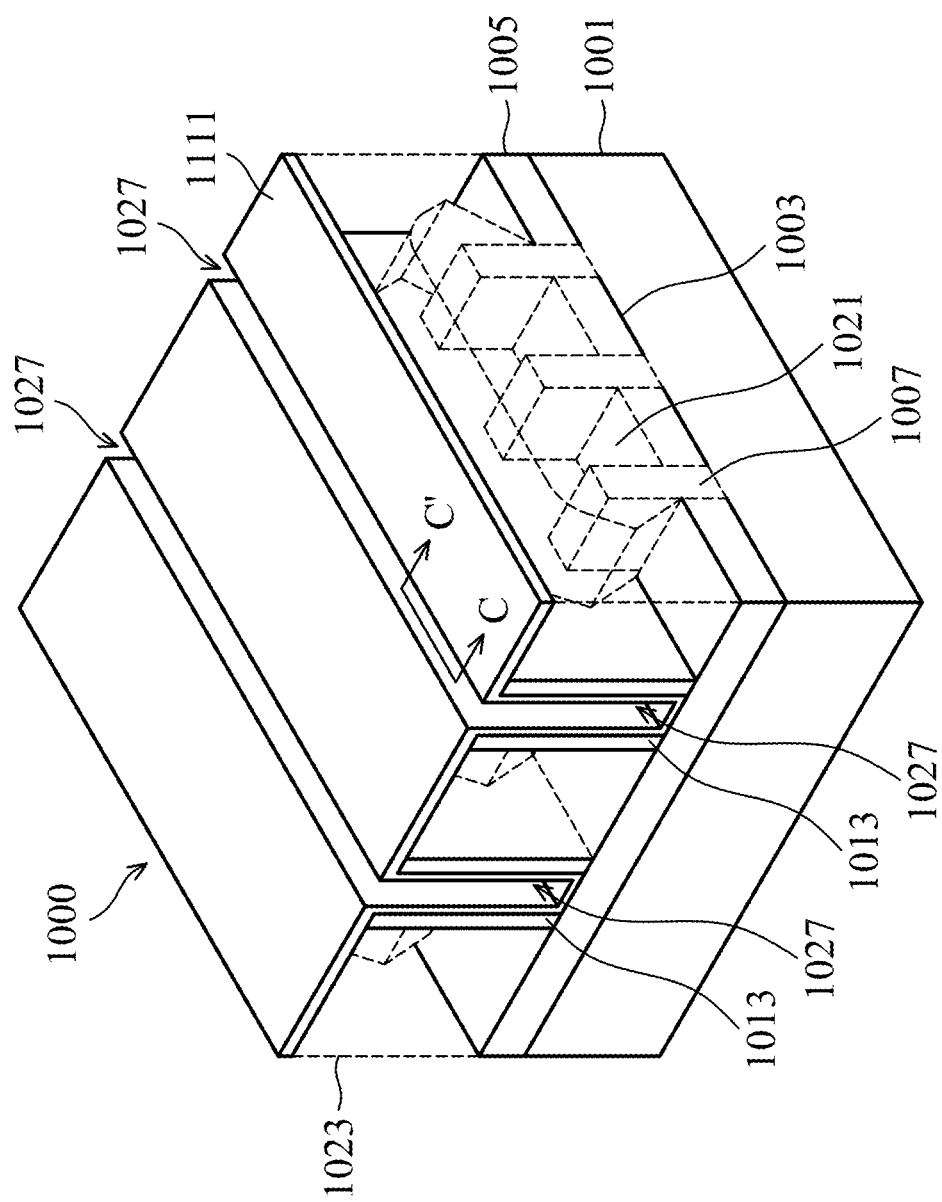

Turning to FIG. 11, this figure illustrates the blanket deposition of the amorphous high-k dielectric layer 211 as an amorphous high-k conformal layer 1111 over the finFET device 1000 once the dummy gate electrodes and the dummy gate dielectrics of the dummy stacks have been removed to form openings 1027. As such, the amorphous high-k conformal layer 1111 is deposited over and conforms to the upper surfaces and sidewalls of the planarized first spacers 1013, the exposed surfaces of the fins 1007 in the channel regions of the finFET device 1000 at the bottom of the openings 1027 formed between the first spacers 1013 and the exposed surfaces of the ILD layer 1023 over the source/drain regions 1021 of the finFET device 1000.

In some embodiments, the amorphous high-k conformal layer 1111 is deposited as an amorphous matrix layer using any of the high-k materials such as hafnium oxide ($HfO_2$), zirconium oxide ($ZrO_2$), yttrium oxide ($Y_2O_3$), lanthanum oxide ($La_2O_3$), scandium oxide ($Sc_2O_3$), aluminum oxide ($Al_2O_3$), and complexes thereof, as described above with respect to the amorphous high-k dielectric layer 211. Furthermore, the high-k materials of the amorphous high-k conformal layer 1111 may include undoped films and doped films and may comprise any of the dopants such as silicon (Si), yttrium (Y), zirconium (Zr), scandium (Sc), lanthanum (La), aluminum (Al), gadolinium (Gd), and the like, as described above with respect to the amorphous high-k dielectric layer 211.

According to some embodiments, the amorphous high-k conformal layer 1111 is formed with a relative permittivity greater than about 7 and a thickness between about 10 Å and about 80 Å to minimize and/or prevent leakage current through the amorphous high-k conformal layer 1111 of the finFET device 1000 once formed. In some embodiments, the amorphous high-k conformal layer 1111 is formed with an amorphous structure and/or is with a partially crystallized structure (e.g., crystalline regions formed within and separated by an amorphous matrix layer). According to some embodiments, the amorphous high-k conformal layer 1111 is formed as an ultrathin film (e.g., film with a thickness of between about 10 Å and about 50 Å, such as about 30 Å, or even less than 20 Å) while minimizing and/or altogether preventing leakage current through the amorphous high-k conformal layer 1111 of the finFET device 1000.

According to some embodiments, the amorphous high-k conformal layer 1111 is deposited through a process such as atomic layer deposition (ALD), or the like to a thickness of between about 1 nm and about 3 nm, such as about 2.5 nm. Although, any suitable materials, any suitable deposition process and any suitable thicknesses may be utilized for the amorphous high-k conformal layer 1111.

According to some embodiments, the amorphous high-k conformal layer 1111 may be deposited at a low temperature, for example, between about 400° C. and about 250° C., such as about 350° C., or even below about 250° C. for a period of between about 180 sec and about 1,800 sec, such as about 600 sec. As such, re-growth of an optional interfacial oxide layer is prevented between the fin 1007 and the overlying the amorphous high-k conformal layer 1111; furthermore, re-growth of the optional interfacial oxide layer is minimized and/or prevented when oxygen is preserved during the formation of the amorphous high-k conformal layer 1111.

Figure 12:
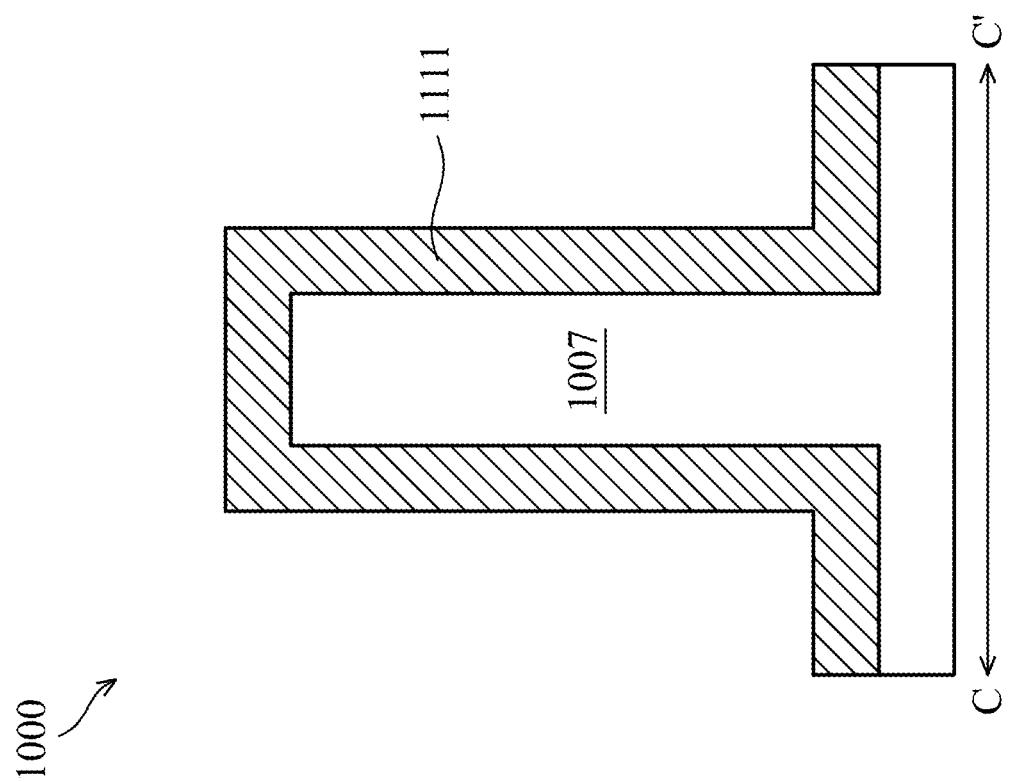

FIG. 12 illustrates a cross-sectional view, along cut-line C-C' of FIG. 11. In particular, FIG. 12 illustrates the deposition of the amorphous high-k conformal layer 1111, wherein the amorphous high-k conformal layer 1111 is deposited over and conforms to the exposed surfaces of the fins 1007 in the channel regions of the finFET device 1000 formed between sidewalls of the first spacers 1013 within the openings 1027.

Figure 13:
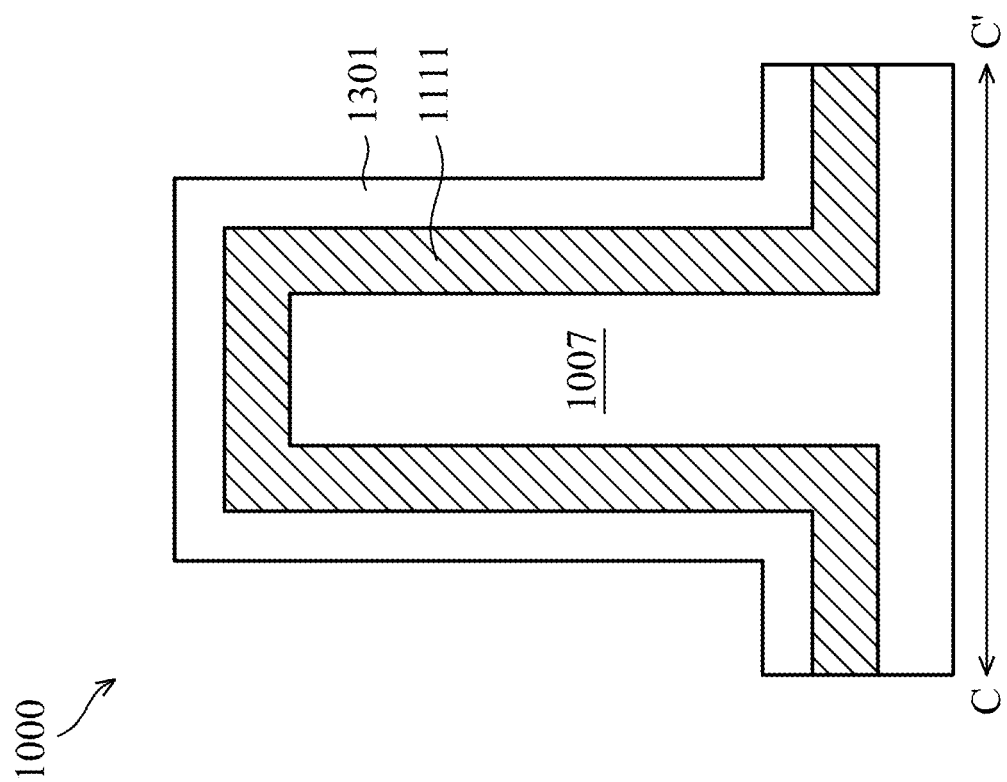

FIG. 13 illustrates a cross-sectional view, along cut-line C-C' of FIG. 11 of a blanket deposition of the capping layer 301 as a conformal capping layer 1301 over the finFET device 1000. As such, the conformal capping layer 1301 is deposited over and conforms to the upper surfaces and sidewalls of the amorphous high-k conformal layer 1111 of the finFET device 1000.

In some embodiments, the conformal capping layer 1301 may be formed over the amorphous high-k conformal layer 1111 of FIG. 12. The conformal capping layer 1301 may be deposited as a single layer or as a multi-layer thin film using one or more materials including metals such as, TiN, TaN, and W; amorphous silicon (e.g., a-Si); high-K dielectrics such as $Al_2O_3$, $ZrO_2$, and $TiO_2$; compounds thereof, or the like, as described above with respect to the capping layer 301. The conformal capping layer 1301 may be deposited through a process such as atomic layer deposition (ALD), or the like to a thickness of between about 1 nm and about 50 nm, such as about 2 nm. Although any suitable material, any suitable deposition process, and any suitable thickness may be utilized for the conformal capping layer 1301.

Figure 14:
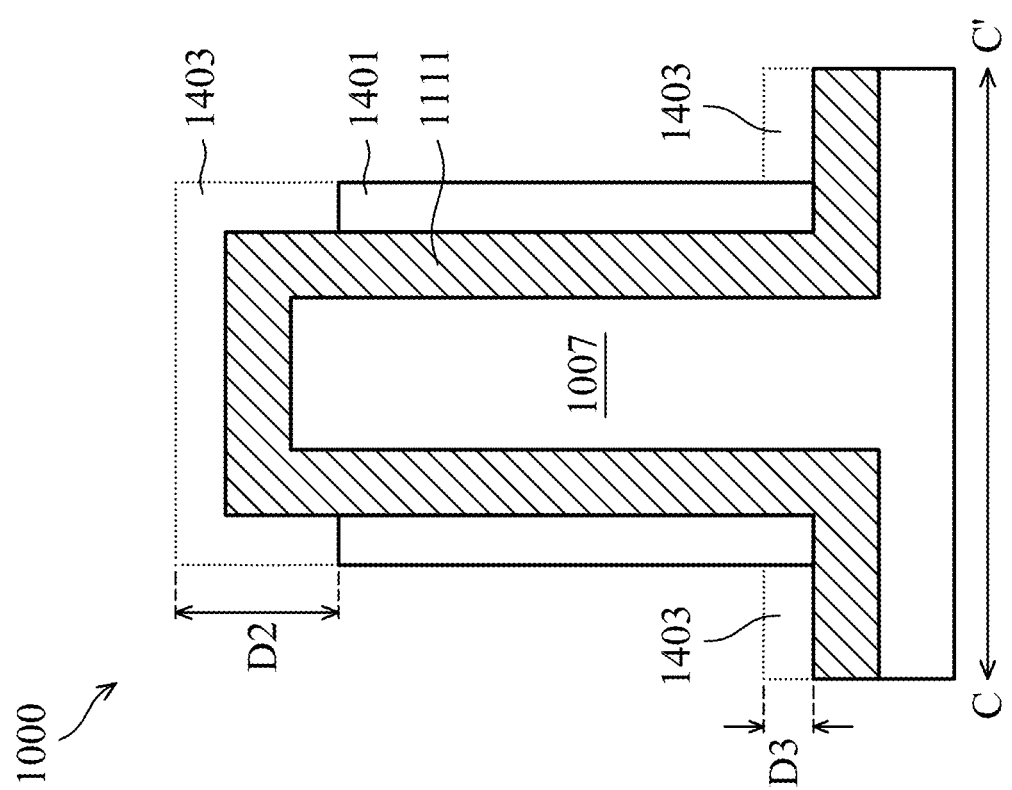

FIG. 14 is a cross-sectional view, along cut-line C-C' of FIG. 11, and illustrates the formation of conformal capping layer openings 1403 in the conformal capping layer 1301 as intermediate steps in the process of forming the finFET device 1000, in accordance with some embodiments. The conformal capping layer openings 1403 are formed in the conformal capping layer 1301 by performing a timed etching process to remove portions of the conformal capping layer 1301 and to expose desired portions of the amorphous high-k conformal layer 1111 in preparation for further processing.

According to some embodiments, the timed etching process is performed on horizontal surfaces of the conformal capping layer 1301 using an anisotropic etching process (e.g., reactive ion etching (RIE)) with etchants selective to the materials of the conformal capping layer 1301. The timed etching process is stopped prior to a complete removal of the conformal capping layer 1301, leaving behind a residual portion of the conformal capping layer 1301 as sidewall capping masks 1401. Once a pre-determined time has elapsed, the etching process stops so that the process does not fully remove the conformal capping layer 1301 from over the amorphous high-k conformal layer 1111.

According to some embodiments, the timed etching process may be performed using etchants such as SC1, $SF_6$, combinations thereof, and the like. In some embodiments, the conformal capping layer 1301 may be etched for a pre-determined time period of between about 30 sec and about 600 sec, such as about 180 sec. As such, horizontal surfaces of the conformal capping layer 1301 disposed over the tops of the fins 1007 are removed to a depth D2 of between about 10 Å and about 50 Å, such as about 20 Å and horizontal surfaces of the conformal capping layer 1301 disposed over substrate 1001 at the base of the fins 1007 are removed to a depth D3 of between about 10 Å and about 30 Å, such as about 20 Å. With the materials of the conformal capping layer 1301 removed portions of the amorphous high-k conformal layer 1111 are exposed through openings 1403 of the sidewall capping mask 1401.

In some embodiments, the etching process is stopped at the surface of the amorphous high-k conformal layer 1111 without reducing the thickness of the material. In other embodiments, the timed etching process may etch into the materials of the exposed portions of the amorphous high-k conformal layer 1111 reducing the thickness of the materials exposed through openings 1403 of the sidewall capping mask 1401.

Figure 15:
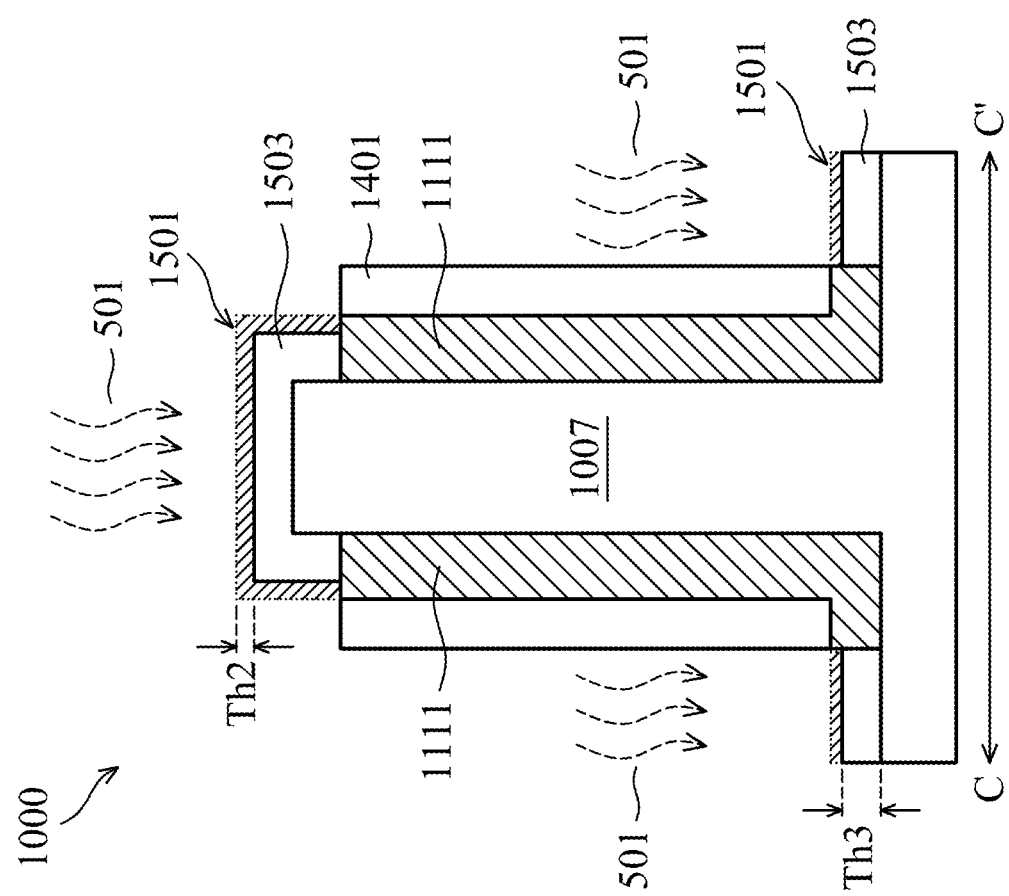

FIG. 15 is the cross-sectional view, along cut-line C-C' of FIG. 11, according to some embodiments, after removal of sacrificial material 1501 of the exposed portions of the amorphous high-k conformal layer 1111 during the timed etching process. FIG. 15 further illustrates, according to some embodiments, formation of adapted conformal regions 1503 during the seeding process 501.

According to some embodiments, a thickness Th2 of the sacrificial material 1501 removed during the timed etching process is between about 1 Å and about 5 Å, such as about 3 Å. As such, the exposed portions of the amorphous high-k conformal layer 1111 may be reduced to a thickness Th3 of between about 10 Å and about 50 Å, such as about 20 Å. However, the exposed portions of the amorphous high-k conformal layer 1111 may be reduced to any suitable thickness Th3 during the timed etching process. However, the thickness of the materials of the amorphous high-k conformal layer 1111 underlying the sidewall capping mask 1401 are not reduced by the timed etching process. As such, the exposed portions of the amorphous high-k conformal layer 1111 have a reduced thickness Th3 as compared to the original thickness retained by the materials of the amorphous high-k conformal layer 1111 underlying the sidewall capping mask 1401.

FIG. 15 further illustrates, according to some embodiments, performing the seeding process 501 on the exposed portions of the amorphous high-k conformal layer 1111. The seeding process 501 may include performing the one or more optional nucleation enhancement treatment and/or the optional doping procedure, as discussed above in order to treat and/or dope the materials of the exposed portions of the amorphous high-k conformal layer 1111. As such, the adapted conformal regions 1503 are formed in the amorphous high-k conformal layer 1111 in preparation for a crystallization process to be performed on the finFET device 1000. The seeding process 501 may be performed to boost an ability of the amorphous high-k conformal layer 1111 to crystallize, to control a crystalline phase to be adopted by the amorphous high-k conformal layer 1111, and/or to control an orientation of the crystal growth of the amorphous high-k conformal layer 1111, as discussed above with respect to FIG. 5.

Additionally, in embodiments in which dopants or inert species are implanted into the amorphous high-k conformal layer 1111, the implantation process may not implant into the entire height of the amorphous high-k conformal layer 1111. As such, a concentration gradient of the implanted species may be present within the amorphous high-k conformal layer 1111. For example, the implanted species may have a higher concentration at a top of the amorphous high-k conformal layer 1111, while having a lower concentration (or even a zero concentration) at a bottom of the amorphous high-k conformal layer 1111.

Figure 16:
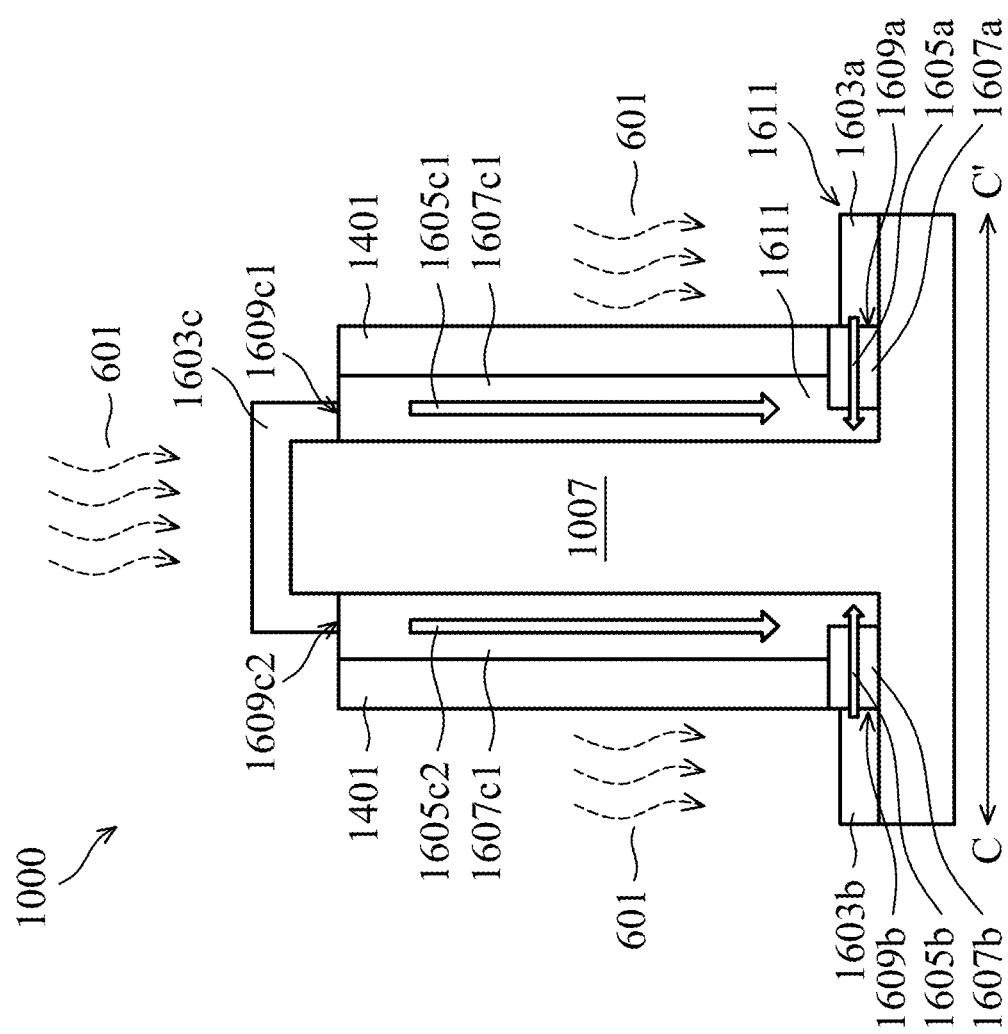

FIG. 16 is the cross-sectional view, along cut-line C-C' of FIG. 11, according to some embodiments, and illustrates the crystallization process 601 performed on the amorphous high-k conformal layer 1111 to form a crystalline high-k conformal layer 1611 according to some embodiments. FIG. 16 further illustrates orientations of crystalline growth 1605 within the amorphous high-k conformal layer 1111 during the crystallization process 601. In an embodiment the crystallization process 601 may be performed as discussed above with respect to FIG. 6, and forms seeding sections 1603a, 1603b, and 1603c, crystalline section interfaces 1609a, 1609b, 1609c1 and 1609c2, and growth sections 1607a, 1607b, 1607c1, and 1607c2.

Additionally, in embodiments in which an implantation is performed and forms a concentration gradient of implantations, the crystalline growth 1605 may create different crystalline orientations along the height of the growth sections 1607c1 and 1607c2. In a particular embodiment the difference in concentrations can create a tetragonal phase at a top of the growth sections 1607c1 and 1607c2, a cubic phase at a middle section of the growth sections 1607c1 and 1607c2, and an orthorhombic phase at a bottom section of the growth sections 1607c1 and 1607c2. However, any suitable combination of phases may be utilized.

Although embodiments disclosed herein are directed towards processes of deposition and anneal of high-k material films over channel regions of fins 1007 of the finFET device 1000, the deposition and anneal processes of the high-k material films may be used in other applications without departing from the spirit of the invention and are considered within scope of the embodiments disclosed herein. Furthermore, the examples provided herein and directed towards the high-k material films having a thicknesses of less than about 2.5 nm and with film compositions including materials such as $HfO_2$, other suitable regions, other semiconductor devices, other suitable thicknesses and other suitable materials may be used and are considered within scope of the embodiments disclosed herein. As such, the thermal budgets may vary according to film thicknesses and according to film compositions without departing from the spirit of the embodiments disclosed.

Figure 17:
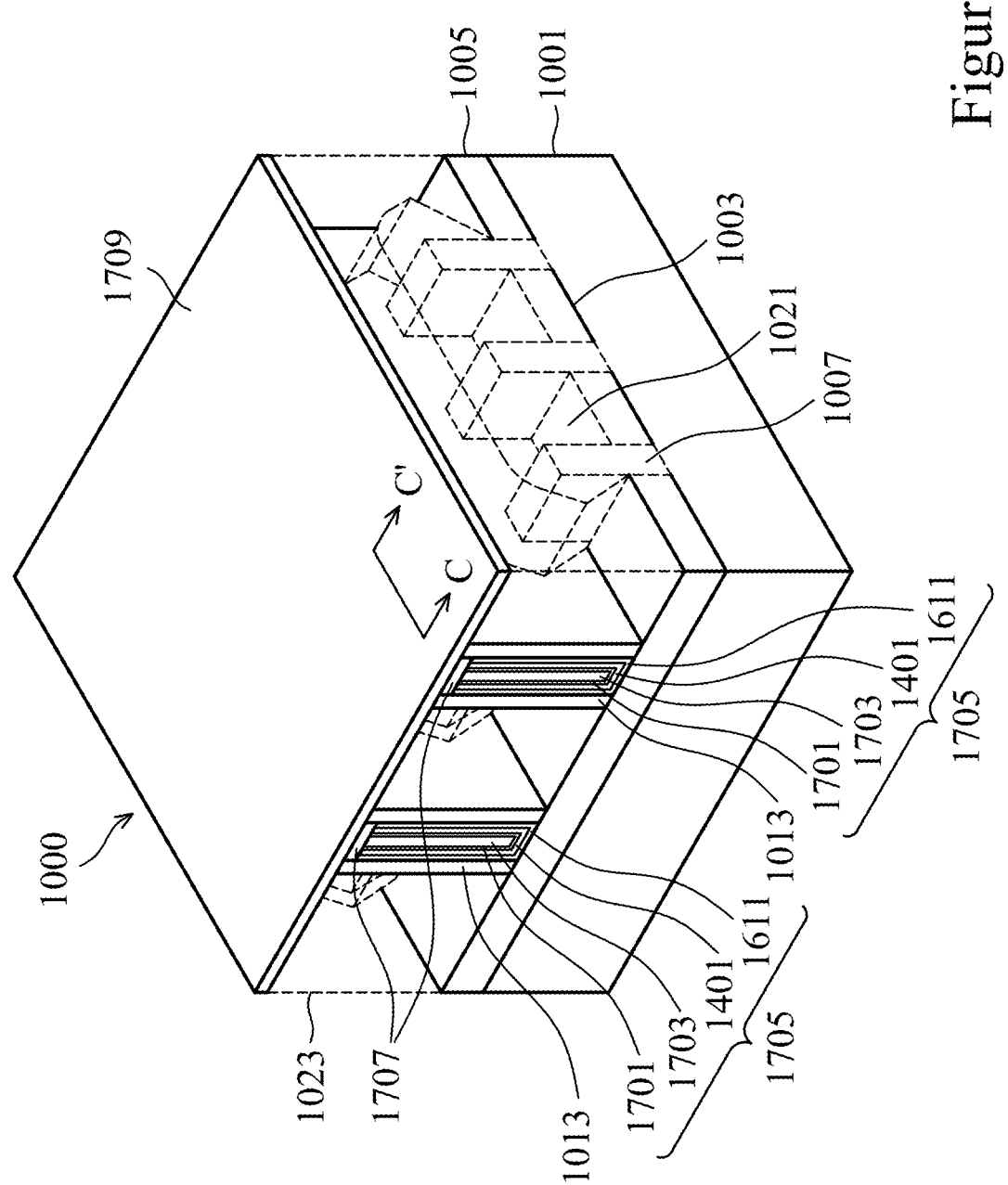

FIG. 17 illustrates, the formation of metal gate electrode structures 1705 of the finFET device 1000 and formation of a first etch stop layer 1709 over the metal gate electrode structures 1705, in accordance with some embodiments. Once the crystalline high-k conformal layer 1611 has been formed as illustrated in FIG. 16, a series of metal layers may be deposited over the sidewall capping mask 1401 and the crystalline high-k conformal layer 1611. According to some embodiments, a first metal layer 1701 may be formed adjacent to the sidewall capping mask 1401 and may be formed from a first metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The first metal material of the first metal layer 1701 may be deposited using a deposition process such as atomic layer deposition, chemical vapor deposition, sputtering, or the like, to a thickness of between about 5 Å and about 200 Å, although any suitable deposition process or thickness may be used.

In some embodiments, the first metal layer 1701 may be a compound metal layer including a second metal material formed adjacent to the first metal material and, in a particular embodiment, may be similar to the first metal material. For example, the second metal material may be formed from a second metallic material such as Ti, TiAlN, TaC, TaCN, TaSiN, Mn, Zr, TiN, TaN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. Additionally, the second metal material of the first metal layer 1701 may be deposited using a deposition process such as atomic layer deposition, chemical vapor deposition, sputtering, or the like, to a thickness of between about 5 Å and about 200 Å, although any suitable deposition process or thickness may be used.

A third metal material 1703 fills a remainder of the openings 1027 left behind by the removal of the dummy gate electrodes. In an embodiment the third metal material 1703 is a third metallic material such as W, Al, Cu, AlCu, W, Ti, TiAlN, TaC, TaCN, TaSiN, Mn, Zr, TiN, Ta, TaN, Co, Ni, combinations of these, or the like, and may be deposited using a deposition process such as atomic layer deposition, chemical vapor deposition, sputtering, or the like to fill and/or overfill the openings 1027 left behind by the removal of the dummy gate electrodes. In a particular embodiment, the third metal material 1703 may be deposited to a thickness of between about 5 Å and about 500 Å, although any suitable material, deposition process, and thickness may be utilized.

Once the openings 1027 left behind by the removal of the dummy gate electrodes have been filled, metal gate electrode structures 1705 may be formed from the materials filling the openings 1027 by planarizing the materials in order to remove any excess material that is outside of the openings 1027. In a particular embodiment the removal may be performed using a planarization process such as chemical mechanical polishing (CMP). However, any suitable planarization and removal process may be utilized.

After the materials of the metal gate electrode structures 1705 have been formed and planarized, the materials of the metal gate electrode structures 1705 may be recessed and capped with capping layers 1707. In an embodiment the materials of the metal gate electrode structures 1705 may be recessed using, e.g., a wet or dry etching process that utilizes etchants selective to the materials of the metal gate electrode structures 1705. In an embodiment the materials of the metal gate electrode structures 1705 may be recessed a distance of between about 5 nm and about 150 nm, such as about 120 nm. However, any suitable process and distance may be utilized.

Once the materials of the metal gate electrode structures 1705 have been recessed, the capping layers 1707 may be deposited and planarized with the first spacers 1013. In an embodiment the capping layers 1707 is a material such as SiN, SiON, SiCON, SiC, SiOC, combinations of these, or the like, deposited using a deposition process such as atomic layer deposition, chemical vapor deposition, sputtering, or the like. The capping layers 1707 may be deposited to a thickness of between about 5 Å and about 200 Å, and then planarized using a planarization process such as chemical mechanical polishing such that the capping layers 1707 are planar with the first spacers 1013.

FIG. 17 additionally illustrate a formation of a first etch stop layer 1709 over the metal gate electrode structures 1705. In one embodiment, the first etch stop layer 1709 may be formed of silicon nitride using plasma enhanced chemical vapor deposition (PECVD), although other materials such as SiON, SiCON, SiC, SiOC, $SiC_xN_y$, $SiO_x$, other dielectrics, combinations thereof, or the like, and alternative techniques of forming the first etch stop layer 1709, such as low pressure CVD (LPCVD), PVD, or the like, could alternatively be used. The first etch stop layer 1709 may be formed to a thickness of between about 5 Å and about 200 Å or between about 5 Å and about 50 Å.

In accordance with an embodiment, a method includes: depositing a dielectric layer over a semiconductor substrate; depositing a capping layer over the dielectric layer; exposing a seeding section of the dielectric layer through openings within the capping layer; performing a crystallization process to crystallize the dielectric layer, wherein the crystallization process crystallizes a portion of the seeding section prior to crystallizing the dielectric layer covered by the capping layer; and forming a gate stack over the crystallized dielectric layer. In an embodiment, the depositing the dielectric layer comprises depositing the dielectric layer to a thickness of less than 3 nm. In an embodiment, the method further includes performing an implantation into the dielectric layer prior to the performing the crystallization process. In an embodiment, the performing the implantation implants argon. In an embodiment, after the performing the crystallization process the dielectric layer is in a tetragonal phase. In an embodiment, the forming the gate stack forms a planar transistor. In an embodiment, the depositing the dielectric layer deposits the dielectric layer over a semiconductor fin of the semiconductor substrate.

In accordance with another embodiment, a method includes: depositing a high-k gate dielectric over a semiconductor fin; covering a surface of the high-k gate dielectric with a capping layer; removing a portion of the capping layer to expose a first surface of the high-k gate dielectric without exposing a second surface of the high-k gate dielectric; and annealing the high-k gate dielectric, wherein the annealing the high-k gate dielectric uniaxially crystallizes the second surface after crystallizing the first surface. In an embodiment, the high-k gate dielectric is less than 3 nm thick. In an embodiment, the method further includes implanting a dopant into the first surface prior to the annealing the high-k gate dielectric. In an embodiment, the dopant is an inert element. In an embodiment, the method further includes treating the first surface with an inert plasma prior to the annealing the high-k gate dielectric. In an embodiment, the high-k gate dielectric comprises hafnium oxide. In an embodiment, the hafnium oxide is doped with zirconium.

In accordance with yet another embodiment, a semiconductor device includes: a semiconductor fin over a semiconductor substrate; a gate dielectric over the semiconductor fin, the gate dielectric having a thickness of less than 3 nm and having a first crystalline orientation; a capping layer adjacent to and in physical contact with at least a portion of the gate dielectric; and a gate electrode overlying the gate dielectric and the capping layer, the gate electrode extending through the capping layer to physically contact a portion of the gate dielectric. In an embodiment the gate dielectric is hafnium oxide. In an embodiment the semiconductor device further includes a capping layer located between the gate dielectric and the gate electrode, wherein the gate electrode is in physical contact with a portion of the gate dielectric. In an embodiment the first crystalline orientation is a tetragonal orientation. In an embodiment, the first crystalline orientation is a cubic orientation. In an embodiment the gate dielectric comprises a concentration gradient of an inert element, wherein a concentration of the inert element increases as the gate dielectric extends away from the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
    a transistor comprising:
        a semiconductor fin;
        a crystallized high-k layer adjacent to the semiconductor fin, the high-k layer comprising a concentration gradient of a first species and having different crystalline orientations along a height of the high-k layer;
        a capping layer adjacent to the high-k layer; and
        a series of metal layer adjacent to the capping layer; and
    a first etch stop layer over the transistor.

2. The semiconductor device of claim 1, wherein the crystallized high-k layer has a tetragonal phase at a top of the crystallized high-k layer.

3. The semiconductor device of claim 2, wherein the crystallized high-k layer has an orthorhombic phase at a bottom of the crystallized high-k layer.

4. The semiconductor device of claim 3, wherein the crystallized high-k layer has a cubic phase between the top of the crystallized high-k layer and the bottom of the crystallized high-k layer.

5. The semiconductor device of claim 1, wherein the concentration gradient of the first species has a higher concentration at a top of the crystallized high-k layer and a lower concentration at a bottom of the crystallized high-k layer.

6. The semiconductor device of claim 1, wherein the crystallized high-k layer has a first portion covered by the capping layer and a second portion exposed by the capping layer.

7. The semiconductor device of claim 6, wherein the second portion has a smaller thickness than the first portion.

8. A semiconductor device comprising:
    a crystallized high-k dielectric layer, the crystallized high-k dielectric layer having multiple crystalline orientations;
    a first species located within the crystallized high-k dielectric layer, the first species having a concentration gradient wherein a concentration of the first species decreases as a depth from a top surface of the crystallized high-k dielectric layer increases;
    a semiconductor fin in physical contact with the crystallized high-k dielectric layer;
    a capping layer in physical contact with the crystallized high-k dielectric layer and located on an opposite side of the crystallized high-k dielectric layer than the semiconductor fin; and
    at least one metal layer adjacent to the capping layer.

9. The semiconductor device of claim 8, wherein the multiple crystalline orientations comprise a cubic phase, an orthorhombic phase, and a tetragonal phase.

10. The semiconductor device of claim 8, wherein the capping layer comprises multiple films.

11. The semiconductor device of claim 10, wherein the multiple films comprise titanium nitride and tantalum nitride.

12. The semiconductor device of claim 8, wherein the capping layer comprises amorphous silicon.

13. The semiconductor device of claim 8, wherein the capping layer has a thickness of between about 1 nm and about 50 nm.

14. The semiconductor device of claim 13, wherein the capping layer has a thickness of between about 1 nm and about 2 nm.

15. A semiconductor device comprising:
- a semiconductor fin overlying a substrate;
- a capping layer overlying the substrate; and
- a crystallized material extending from the semiconductor fin to the capping layer, the crystallized material having multiple crystalline orientations and comprising:
  - a first region with a first concentration of dopants; and
  - a second region with a second concentration of dopants between the first region and the substrate, the first concentration being larger than the second concentration.

16. The semiconductor device of claim 15, wherein the capping layer has a thickness of between about 1 nm and about 50 nm.

17. The semiconductor device of claim 15, wherein the crystallized material comprises hafnium oxide.

18. The semiconductor device of claim 15, wherein the crystallized material comprises zirconium oxide.

19. The semiconductor device of claim 15, wherein the crystallized material extends out of the capping layer a distance of between about 10 Å and about 50 Å.

20. The semiconductor device of claim 15, wherein the crystallized material extends out of the capping layer a distance of between about 10 Å and about 20 Å.

* * * * *